(12) United States Patent
Choi et al.

(10) Patent No.: US 11,621,675 B2
(45) Date of Patent: *Apr. 4, 2023

(54) AMPLIFIER AND IMAGE SENSOR DEVICE INCLUDING THE SAME

(71) Applicant: SAMSUNG ELECTRONICS CO., LTD., Suwon-si (KR)

(72) Inventors: Seungnam Choi, Hwaseong-si (KR); Yunjae Suh, Suwon-si (KR); Masamichi Ito, Hwaseong-si (KR); Junseok Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/467,519

(22) Filed: Sep. 7, 2021

(65) Prior Publication Data
US 2021/0399689 A1    Dec. 23, 2021

Related U.S. Application Data

(63) Continuation of application No. 16/886,899, filed on May 29, 2020, now Pat. No. 11,114,983.

(30) Foreign Application Priority Data

Sep. 3, 2019   (KR) .................. 10-2019-0108772

(51) Int. Cl.
| | |
|---|---|
| *H04N 5/351* | (2011.01) |
| *H04N 5/357* | (2011.01) |
| *H04N 5/374* | (2011.01) |
| *H04N 5/378* | (2011.01) |
| *H03F 1/26* | (2006.01) |
| *H03F 3/16* | (2006.01) |

(Continued)

(52) U.S. Cl.
CPC ............... *H03F 1/26* (2013.01); *H03F 3/16* (2013.01); *H04N 5/351* (2013.01); *H04N 5/357* (2013.01);
(Continued)

(58) Field of Classification Search
CPC ...... H04N 5/351; H04N 5/357; H04N 5/3745; H04N 5/37455; H04N 5/335;
(Continued)

(56) References Cited

U.S. PATENT DOCUMENTS

| | | |
|---|---|---|
| 7,728,269 B2 | 6/2010 | Lichtsteiner et al. |
| 7,876,627 B2 | 1/2011 | Akiyama et al. |

(Continued)

OTHER PUBLICATIONS

Notice of Allowance dated Apr. 19, 2021 In Correspondng U.S. Appl. No. 16/886,899.

*Primary Examiner* — Marly S Camargo
(74) *Attorney, Agent, or Firm* — F. Chau & Associates, LLC

(57) ABSTRACT

An amplifier includes a first capacitor connected between an input node and a floating node, a second capacitor connected between the floating node and an output node, an amplifying element connected between a power supply voltage and the output node and operating in response to a voltage level of the floating node, a current bias source connected between the output node and a ground voltage, a first reset switch connected between the floating node and an intermediate node and operating in response to a reset bias, a second reset switch connected between the intermediate node and the output node and operating in response to the reset bias, and a reset bias generator circuit that outputs the reset bias in response to a reset signal. The reset bias is one of a reset voltage of the intermediate node, the power supply voltage, and the ground voltage.

20 Claims, 27 Drawing Sheets

(51) Int. Cl.
  *H03F 1/34* (2006.01)
  *H03F 3/72* (2006.01)
  *H04N 5/3745* (2011.01)

(52) U.S. Cl.
  CPC ..... *H04N 5/3745* (2013.01); *H03F 2200/372* (2013.01)

(58) Field of Classification Search
  CPC .... H04N 5/3559; H04N 5/378; H03F 1/0211; H03F 1/26; H03F 1/342; H03F 3/082; H03F 3/16; H03F 3/72; H03F 2200/372
  USPC ............ 348/301, 300, 308, 294, 297, 229.1, 348/222.1; 257/123, 159, 160, 291, 292, 257/443, 299; 250/208.1
  See application file for complete search history.

(56) References Cited

U.S. PATENT DOCUMENTS

| | | | |
|---|---|---|---|
| 7,935,918 B2 | 5/2011 | Mheen et al. | |
| 8,174,601 B2 | 5/2012 | Compton et al. | |
| 8,446,504 B2* | 5/2013 | Taruki | H04N 5/3698 348/300 |
| 9,739,660 B2 | 8/2017 | Suh et al. | |
| 10,070,084 B2 | 9/2018 | Guidash et al. | |
| 10,567,682 B2 | 2/2020 | Matolin et al. | |
| 11,114,983 B2* | 9/2021 | Choi | H04N 5/351 |
| 11,212,471 B2* | 12/2021 | Moue | H04N 5/378 |
| 2005/0128326 A1 | 6/2005 | Korthout et al. | |
| 2005/0218299 A1 | 10/2005 | Olsen et al. | |
| 2007/0146008 A1 | 6/2007 | Tak et al. | |
| 2009/0322921 A1 | 12/2009 | Ishimoto et al. | |
| 2011/0234871 A1* | 9/2011 | Taruki | H04N 5/3559 348/297 |
| 2013/0248688 A1* | 9/2013 | Yamashita | H04N 5/357 250/208.1 |
| 2014/0034808 A1* | 2/2014 | Zhang | H03K 17/162 250/208.1 |
| 2015/0201141 A1* | 7/2015 | Petilli | H04N 5/3696 348/301 |
| 2018/0098003 A1 | 4/2018 | Matolin et al. | |
| 2021/0067100 A1 | 3/2021 | Choi et al. | |
| 2021/0185250 A1* | 6/2021 | Moue | H04N 5/357 |

* cited by examiner

AMPLIFIER AND IMAGE SENSOR DEVICE INCLUDING THE SAME

CROSS-REFERENCE TO RELATED APPLICATIONS

This application is a continuation of U.S. patent application Ser. No. 16/886,899 filed on May 29, 2020, which claims priority under 35 U.S.C. § 119 to Korean Patent Application No. 10-2019-0108772 filed on Sep. 3, 2019, in the Korean Intellectual Property Office, the disclosures of which are incorporated by reference herein in their entirety.

TECHNICAL FIELD

Exemplary embodiments of the inventive concept described herein relate to a semiconductor device, and more particularly, to an amplifier and an image sensor including the same.

DISCUSSION OF THE RELATED ART

An image sensor device is a device that generates an electrical signal or a digital signal based on a light incident from the outside. An event-based sensor outputting an event signal depending on the amount of change of a magnitude of the light incident from the outside, for example, a dynamic vision sensor (DVS), is currently being developed.

In general, the event-based sensor outputs an event signal by using various components such as a converter and an amplifier. In this case, a leakage current or device noise may occur at the converter or the amplifier due to various factors, thereby causing an unintended false event.

SUMMARY

Exemplary embodiments of the inventive concept provide an amplifier capable of improving reliability by removing a leakage current and a device noise, and an image sensor device including the amplifier.

According to an exemplary embodiment, an amplifier includes a first capacitor connected between an input node and a floating node, a second capacitor connected between the floating node and an output node, an amplifying element connected between a power supply voltage and the output node and operating in response to a voltage level of the floating node, a current bias source connected between the output node and a ground voltage, a first reset switch connected between the floating node and an intermediate node and operating in response to a reset bias, a second reset switch connected between the intermediate node and the output node and operating in response to the reset bias, and a reset bias generator circuit that outputs the reset bias in response to a reset signal. The reset bias is one of a reset voltage of the intermediate node, the power supply voltage, and the ground voltage.

According to an exemplary embodiment, an amplifier includes an amplifying circuit that includes a first capacitor connected between an input node and a floating node and outputs an output voltage through an output node based on a change of an input voltage received through the input node, a reset switch connected between the floating node and the output node and resetting the floating node and the output node to a reset voltage in response to a reset bias, and a reset bias generator circuit that outputs the reset bias based on the reset voltage in response to a reset signal.

According to an exemplary embodiment, an image sensor device includes a plurality of pixels. Each of the plurality of pixels includes a photo detector that generates a photo current corresponding to a light incident from outside the image sensor device, a converter circuit that converts the generated photo current into an input voltage, an amplifier that receives the input voltage through an input node, amplifies the amount of change of the input voltage, and outputs an output voltage through an output node, a comparator circuit that compares the output voltage with at least two predetermined threshold values and outputs a comparison result, and an output logic circuit that outputs a corresponding event signal based on the comparison result. The amplifier includes a first capacitor connected between the input node and a floating node, a second capacitor connected between the floating node and the output node, an amplifying element connected between a power supply voltage and the output node and operating in response to a voltage level of the floating node, a current bias source connected between the output node and a ground voltage, a first reset switch connected between the floating node and an intermediate node and operating in response to a reset bias, a second reset switch connected between the intermediate node and the output node and operating in response to the reset bias, and a reset bias generator circuit that outputs the reset bias based in response to a reset signal. The reset signal is one of a reset voltage of the intermediate node, the power supply voltage, and the ground voltage.

BRIEF DESCRIPTION OF THE DRAWINGS

The above and other objects and features of the inventive concept will become more apparent by describing in detail exemplary embodiments thereof with reference to the accompanying drawings, in which.

DETAILED DESCRIPTION

Figure 1:
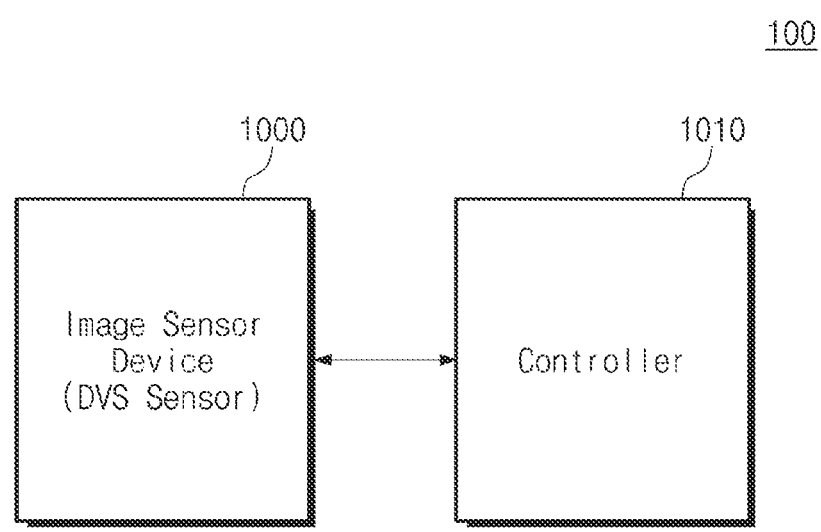
FIG. 1 is a block diagram illustrating an image device according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art. For example, when two or more elements or values are substantially the same as or about equal to each other but are not identical to each other, it is to be understood that the two or more elements or values are approximately the same as or equal to each other within a measurement error as would be understood by a person having ordinary skill in the art.

FIG. 1 is a block diagram illustrating an image device according to an exemplary embodiment of the inventive concept.

Referring to FIG. 1, an image device 100 may include a controller 1010 and an image sensor device 1000. The controller 1010 may be configured to control the image sensor device 1000. In an exemplary embodiment, the controller 1010 may be an image signal processor, or a driver or a processor configured to control the image sensor device 1000. However, the controller 1010 is not limited thereto.

The image sensor device 1000 may be configured to convert a light incident from the outside into an electrical signal or a digital signal. For example, the image sensor device 1000 may include a plurality of pixels. Each of the plurality of pixels may generate an electrical signal or a digital signal corresponding to the amount of light incident from the outside and may provide the generated electrical or digital signal to the controller 1010.

In an exemplary embodiment, the image sensor device 1000 may be an event-based sensor such as a dynamic vision sensor (DVS). Each of the plurality of pixels included in the event-based sensor may be configured to sense a change of the amount of light incident from the outside and to asynchronously output an event signal corresponding to the sensed change. However, the inventive concept is not limited thereto. For example, the image sensor device 1000 may include various devices which are configured to obtain an image from the outside, such as, for example, a CMOS image sensor (CIS) device and a charge coupled device (CCD).

In an exemplary embodiment, the reliability of the image sensor device 1000 may be reduced due to noises coming from various external factors of the image sensor device 1000. Exemplary embodiments provide an image sensor device 1000 with improved reliability, which will be more fully described below with reference to the accompanying drawings.

Figure 2:
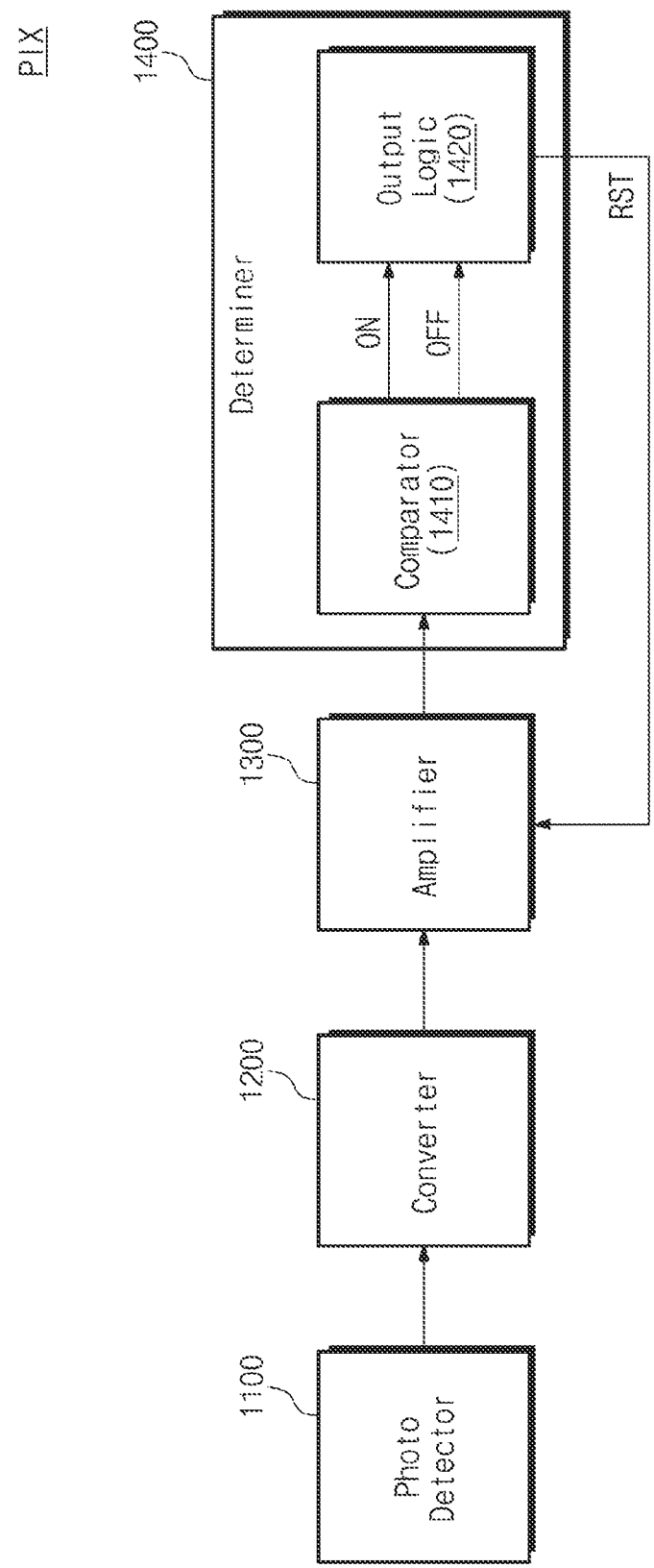
FIG. 2 is a block diagram illustrating an image sensor device of FIG. 1 according to an exemplary embodiment of the inventive concept.

FIG. 2 is a block diagram illustrating a pixel included in an image sensor device of FIG. 1 according to an exemplary embodiment of the inventive concept. For convenience of description, one pixel PIX of the plurality of pixels included in the image sensor device 1000 will be described with reference to FIG. 2 as an example. However, it is to be understood that each of the remaining pixels may have a structure similar to the pixel PIX to be described with reference to FIG. 2.

Referring to FIGS. 1 and 2, the pixel PIX of the image sensor device 1000 may be an event-based pixel or a dynamic vision sensor (DVS) pixel. The pixel PIX may include a photo detector 1100, a converter 1200, an amplifier 1300, and a determiner 1400. The photo detector 1100 may be configured to generate a photo current or a photo charge in response to a light incident from the outside (e.g., from outside of the image sensor device 1000). In an exemplary embodiment, the photo detector 1100 may be a photodiode (PD).

The converter 1200 may be configured to convert the photo current or the photo charge generated from the photo detector 1100 in the form of a voltage. For example, the converter 1200 may convert the photo current or the photo charge into an input voltage. In an exemplary embodiment, the converter 1200 may be a Log I-to-V converter. In an exemplary embodiment, the converter 1200 may be a log amplifier. The converter 1200 may also be referred to has a converter circuit.

The amplifier 1300 may receive a voltage from the converter 1200 as an input voltage, may amplify the amount of change of the received input voltage or a difference between received input voltages, and may output the amplified signal as an output voltage. In an exemplary embodiment, the amplifier 1300 may be a difference amplifier, a differencing amplifier, or a capacitor amplifier.

The determiner 1400 may generate an event signal corresponding to an output voltage of the amplifier 1300, based on the output voltage. For example, the determiner 1400 may include a comparator 1410 and an output logic circuit 1420.

The comparator 1410 may determine whether the output voltage from the amplifier 1300 reaches given threshold values. For example, the comparator 1410 may compare the output voltage with at least two predetermined threshold values and output a comparison result. That the output voltage reaches one of the given threshold values may mean that an event (e.g., an on-event or an off-event) occurs at the corresponding pixel PIX. The comparator 1410 may output comparison signals (e.g., an ON signal or an OFF signal) indicating whether an event occurs, based on a determination result. The output logic circuit 1420 may determine a type of the occurred event (e.g., an on event or an off event) based on signals from the comparator 1410 and may output an event signal corresponding to the determined type (e.g., the determined event). For example, the output logic circuit 1420 may output a corresponding event signal based on the comparison result output by the comparator 1410. The comparator 1410 may also be referred to as a comparator circuit.

Although one pixel is described in the exemplary embodiment of FIG. 2, the inventive concept is not limited thereto. In an exemplary embodiment, the image sensor device 1000 may further include peripheral circuits or additional logic circuits (e.g., an address encoder, an arbiter, and a handshaking logic circuit) configured to output an address or coordinates of a pixel, at which an event (e.g., an on event or an off event) occurs, from among the plurality of pixels by using the Address Event Representation (AER) protocol. In an exemplary embodiment, the AER protocol may be an asynchronous handshaking protocol that is used to transmit an event signal.

In an exemplary embodiment, in the case in which an on-event or an off-event occurs, the output logic circuit 1420 may be configured to output a reset signal RST. The amplifier 1300 may be reset in response to the reset signal RST. In an exemplary embodiment, that the amplifier 1300 is reset may mean that a level of an input node (e.g., a floating node) and a level of an output node are equalized to the same level (e.g., a reset voltage or a reset level). The reset operation may be performed by a reset switch or a reset circuit included in the amplifier 1300.

A leakage current may occur at a reset switch of a conventional amplifier due to various factors. The leakage current of the reset switch changes a voltage of an input node (or a floating node) of the amplifier, thereby causing a change of an output voltage of the amplifier 1300. Also, a DC noise or a device noise may occur at the image sensor device 1000 due to various factors, and this noise may be introduced into the amplifier 1300.

The noise introduced into the amplifier 1300 may cause a voltage change of the input node (or the floating node), and thus, an output voltage of the amplifier 1300 may change. This means that a false event may occur at the determiner 1400. The false event indicates an unintended event or an event that does not actually occur, and may cause a reduction of reliability of the image sensor device 1000. For example, the reliability of the image sensor device 1000 may be reduced due to the leakage current or the device noise of the amplifier 1300.

The amplifier 1300 according to an exemplary embodiment of the inventive concept may include a reset switch circuit configured to block or prevent a leakage current and to block or filter a device noise (or a DC noise). A configuration of the amplifier 1300 according to an exemplary embodiment of the inventive concept will be more fully described with reference to the drawings below.

Figure 3A:
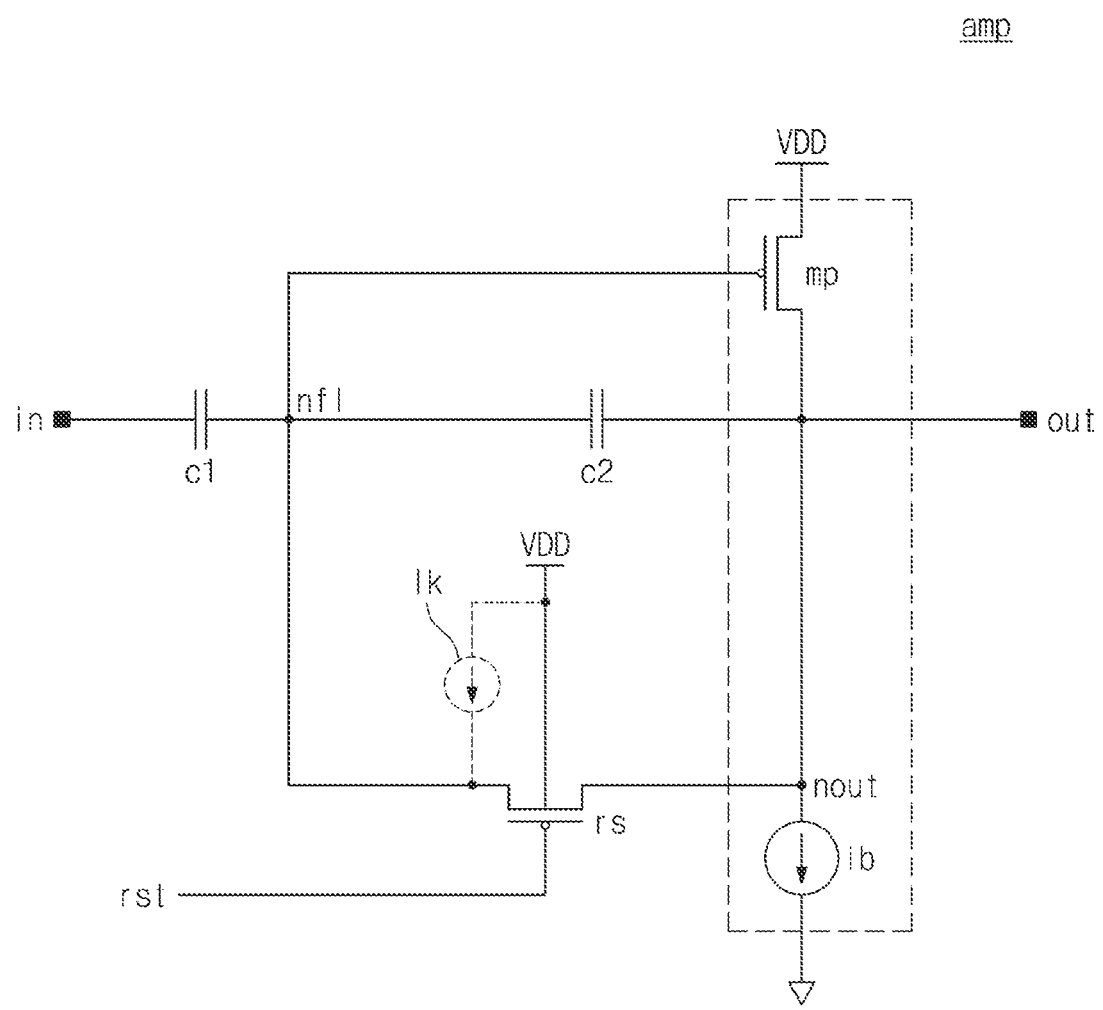
FIGS. 3A and 3B are diagrams for describing an operation of an amplifier according to a comparative example.
Figure 3B:
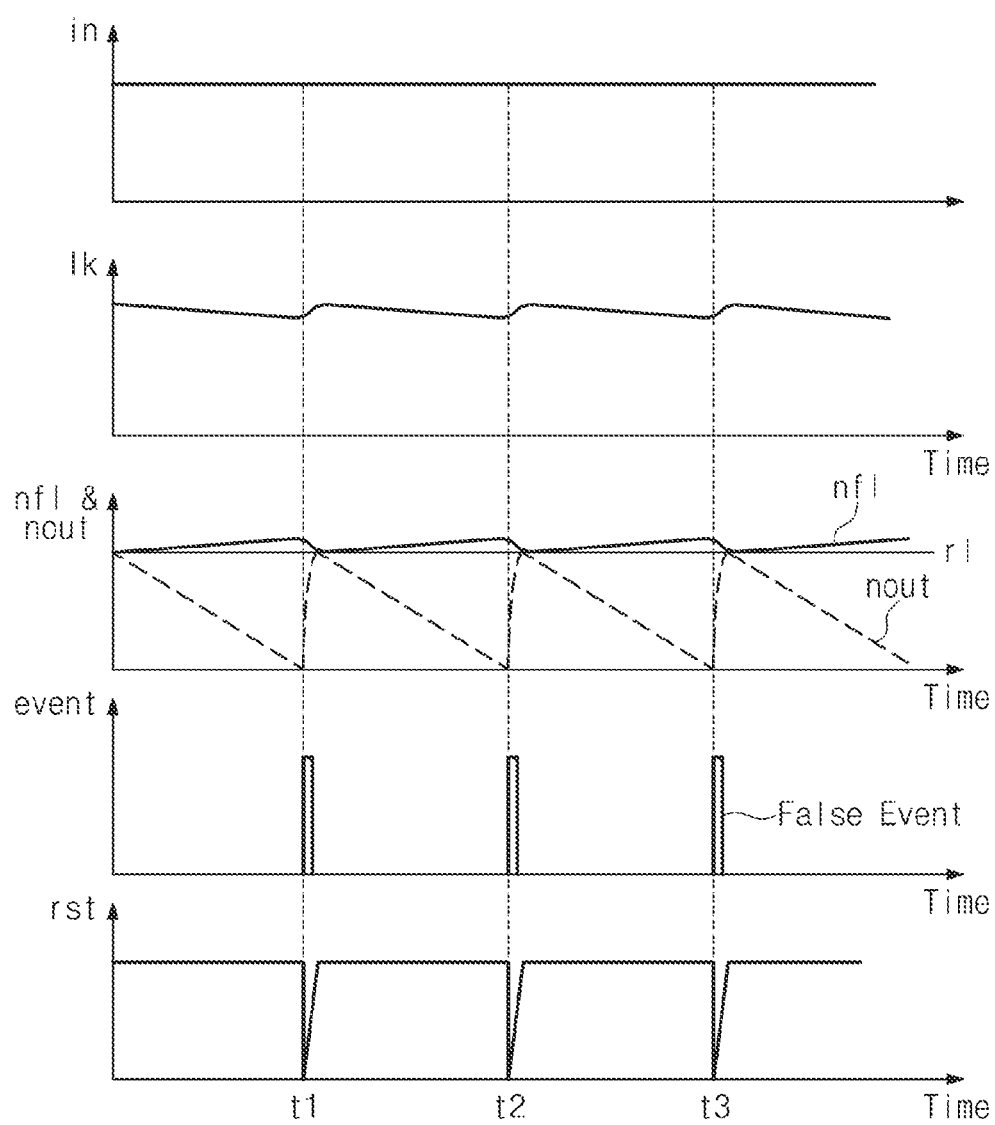

FIGS. 3A and 3B are diagrams for describing an operation of an amplifier according to a comparative example.

The manner in which a false event occurs due to a leakage current occurring at a reset switch (rs) will be described with reference to FIGS. 3A and 3B. Referring to FIGS. 3A and 3B, an amplifier (amp) may include first and second capacitors (c1, c2), an amplifying element (mp), a current bias (ib), and the reset switch (rs).

The first capacitor (c1) may be connected between an input terminal receiving an input voltage (in) and a floating node (nfl). In an exemplary embodiment, the input voltage (in) may be received from the converter 1200 described with reference to FIG. 2. The second capacitor (c2) may be connected between the floating node (nfl) and an output node (nout). In an exemplary embodiment, the output node (nout) may be connected to the determiner 1400 described with reference to FIG. 2, and an output voltage (out) may be provided to the determiner 1400 through the output node nout.

The amplifying element (mp) may be, for example, a p-type metal oxide semiconductor (PMOS) transistor connected between a power supply voltage VDD and the output node (nout) and configured to operate in response to a voltage of the floating node (nfl). The current bias (ib) may be connected between the output node (nout) and a ground node. The reset switch (rs) may be a PMOS transistor connected between the floating node (nfl) and the output node (nout) and configured to operate in response to a reset signal (rst). The reset switch (rs) may reset levels of the floating node (nfl) and the output node (nout) to a reset voltage in response to a low level of the reset signal (rst).

In an exemplary embodiment, the power supply voltage VDD may be applied to a body node of the reset switch (rs) being a PMOS transistor. In the case in which an event does not occur, the reset signal rst of a high level (e.g., a level of the power supply voltage VDD) may be applied to the reset switch (rs). In this case, a voltage difference between a gate and a drain (e.g., the floating node (nfl)) of the reset switch (rs) may cause a leakage current (Ik) that flows from the body node of the reset switch (rs) to the drain (e.g., the floating node (nfl)) of the reset switch (rs). This leakage current (Ik) is called a "gate-induced drain leakage (GIDL) current". Below, a high level or a low level of a particular signal or a particular voltage may indicate a voltage (e.g., a power supply voltage or a ground voltage) for turning on or turning off a corresponding element to the particular signal or voltage.

Because the leakage current (Ik) occurring at the reset switch (rs) is introduced into the floating node (nfl), a voltage of the floating node (nfl) may increase. As the voltage of the floating node (nfl) changes, an output voltages (out) of the output node (nout) may decrease.

For example, as illustrated in FIG. 3B, it is assumed that a level of the input voltage (in) is uniform. In an ideal case, if the input voltage (in) is uniform, a voltage of the output node (nout) does not change. However, as described above, because a voltage of the floating node (nfl) changes (e.g., increases) due to the leakage current (Ik) occurring at the reset switch (rs), the voltage of the output node (nout) may decrease.

In the graphs of FIG. 3B, at a first time t1, a voltage of the output node (nout) may reach a given threshold value. In this case, as described with reference to FIG. 2, an event signal may be generated by the determiner 1400. As the event signal is generated, at the first time t1, the output logic circuit 1420 of the determiner 1400 may activate the reset signal (rst). For example, the output logic circuit 1420 of the determiner 1400 may change the reset signal (rst) from the high level to the low level. In response to the activated reset signal (rst), the reset switch (rs) may reset voltages of the floating node (nfl) and the output node nout to a reset voltage (rl).

As described above, because an event signal is generated when the input voltage (in) is uniform, an event corresponding to the generated event signal may be an unintended false event. That is, even though the input voltage (in) is uniform, an unintended false event may repeatedly occur due to the leakage current (Ik) (e.g., the GIDL current) generated at the reset switch (rs) of the amplifier (amp), at respective times t1, t2, and t3. The repeated false events may cause a reduction of reliability of an image sensor device.

Figure 4A:
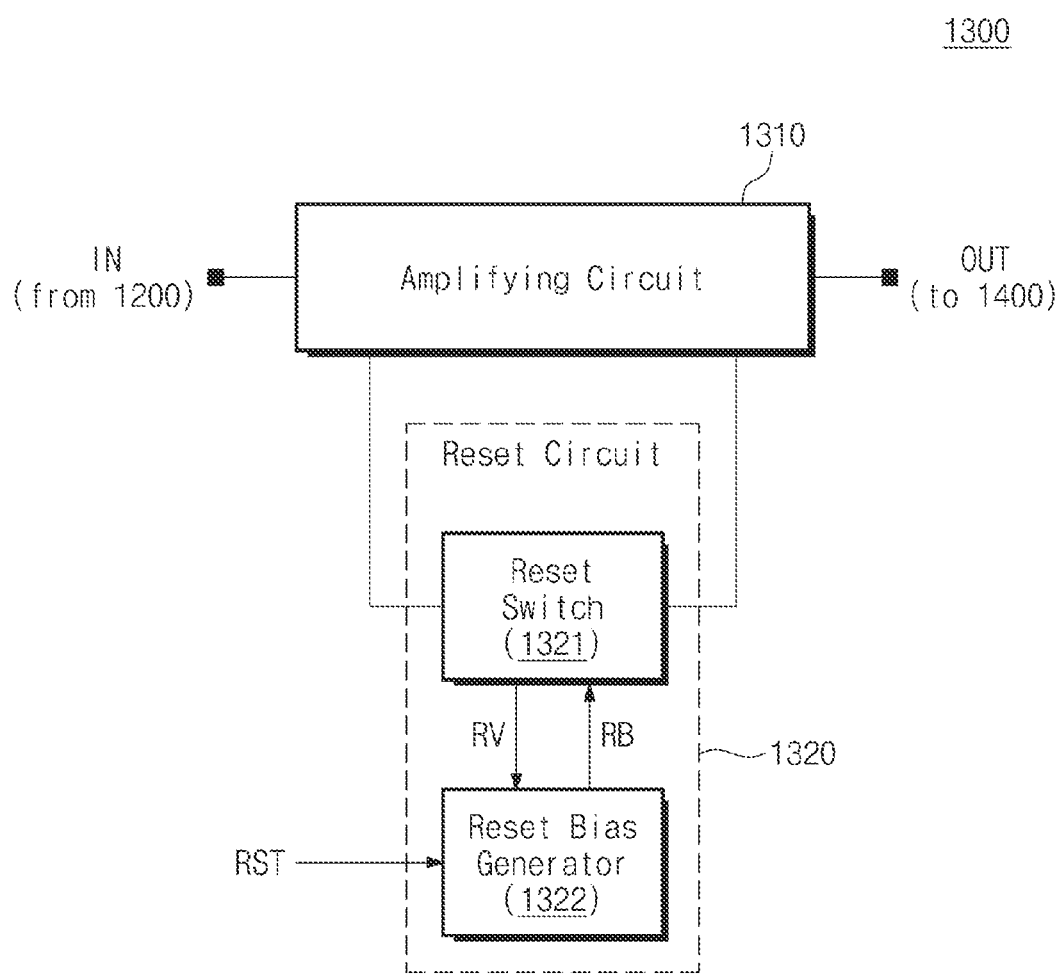
FIGS. 4A and 4B are diagrams illustrating an amplifier of FIG. 2 in detail according to an exemplary embodiment of the inventive concept.
Figure 4B:
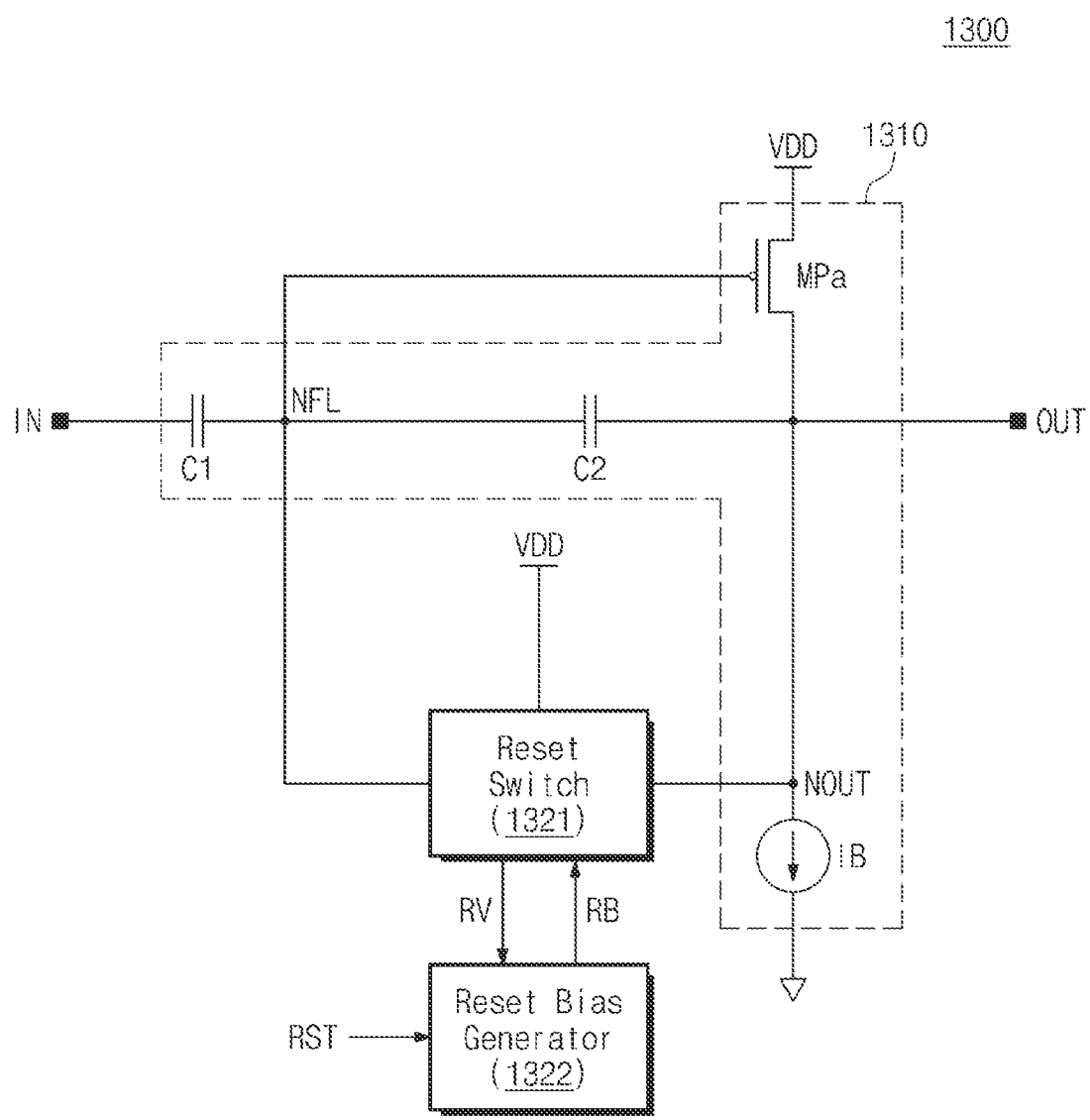

FIGS. 4A and 4B are diagrams illustrating the amplifier 1300 of FIG. 2 according to an exemplary embodiment of the inventive concept.

Referring to FIGS. 4A and 4B, the amplifier 1300 may include an amplifying circuit 1310 and a reset circuit 1320.

The amplifying circuit 1310 may be, for example, a difference amplifier or a differencing amplifier configured to amplify a change of an input voltage IN and to output the amplified change as an output voltage OUT. That is, the amplifying circuit 1310 may output the output voltage OUT based on a change of the input voltage IN. In an exemplary embodiment, the amplifying circuit 1310 may receive the input voltage IN from the converter 1200 and may provide the output voltage OUT to the determiner 1400.

For example, referring to FIG. 4B, the amplifying circuit 1310 may include a first capacitor C1, a second capacitor C2, an amplifying element MPa, and a current bias IB. The current bias IB may also be referred to herein as a current bias source or a current bias source circuit. The first capacitor C1 may be connected between an input terminal receiving the input voltage IN and a floating node NFL. The second capacitor C2 may be connected between the floating node NFL and an output node NOUT. The amplifying element MPa may be connected between the power supply voltage VDD and the output node NOUT and may operate in response to a voltage of the floating node NFL. For example, the amplifying element MPa may be a PMOS transistor, and the voltage of the floating node NFL may be applied to the gate of the amplifying element MPa to control operation of the amplifying element MPa. Thus, the amplifying element MPa may also be referred to herein as an amplifying transistor. The current bias IB may be connected between the output node NOUT and a ground voltage.

Referring again to FIG. 4A, the reset circuit 1320 may be configured to reset voltages of the floating node NFL and the output node NOUT of the amplifying circuit 1310 to the reset voltage RV in response to a reset signal RST from the determiner 1400 (or the output logic circuit 1420).

For example, the reset circuit 1320 may include a reset switch 1321 and a reset bias generator 1322. As illustrated in FIG. 4B, the reset switch 1321 of the reset circuit 1320 may be connected between the floating node NFL and the output node NOUT. The reset switch 1321 may reset voltages of the floating node NFL and the output node NOUT to the reset voltage RV in response to a reset bias RB of the reset bias generator 1322.

The reset bias generator 1322 may generate the reset bias RB based on the reset signal RST and the reset voltage RV. For example, in the case in which the reset signal RST is deactivated (e.g., in the case in which a level of the reset signal RST is the high level or a level of the power supply voltage VDD), the reset bias RB generated by the reset bias generator 1322 may be substantially equal to the reset voltage RV from the reset switch 1321 or may be different from the reset voltage RV as much as a given level.

In the case in which the reset signal RST is activated (e.g., in the case in which a level of the reset signal RST is the low level or a level of a ground voltage VSS), the reset bias RB generated by the reset bias generator 1322 may be the low level or the ground voltage VSS. Alternatively, in the case in which the reset signal RST is activated, the reset bias RB may be a turn-on voltage for turning on elements included in the reset switch 1321.

As described above, the reset switch 1321 may operate in response to the reset bias RB generated by the reset bias generator 1322. In this case, when the reset signal RST is deactivated, the reset bias RB may be substantially equal to or somewhat different from the reset signal RST. In this case, the leakage current (e.g., the GIDL current) at the reset switch (rs) described with reference to FIGS. 3A and 3B may be prevented. For example, as described above, the leakage current at the reset switch (rs) may be generated when a voltage difference between the gate and the drain of the reset switch (rs) is great in a state in which the power supply voltage VDD is applied to the body node of the reset switch (rs).

However, according to an exemplary embodiment of the inventive concept, each of transistors included in the reset switch 1321 may operate in response to the reset bias RB. In this case, the reset bias RB may be lower in level than the reset signal RST, and the reset bias RB may be substantially the same as to or somewhat different from the reset voltage RV. Because the floating node NFL is in a state of being substantially reset to the reset voltage RV, the reset bias RB may be substantially the same as a voltage of the floating node NFL, or a difference between the reset bias RB and the voltage of the floating node NFL may be ignorable. In an exemplary embodiment, that the difference is ignorable may mean that a leakage current (e.g., the GIDL current) is not generated at the reset switch 1321 by the difference of the reset bias RB and the voltage of the floating node NFL.

That is, because a level difference between the gate and the drain of the reset switch 1321 according to an exemplary embodiment of the inventive concept is "0" or is small enough to ignore, the leakage current Ik (e.g., the GIDL current) described with reference to FIGS. 3A and 3B may be prevented. The reset circuit 1320 of the amplifier 1300 according to an exemplary embodiment of the inventive concept may prevent a leakage current, and as a result, a false event may be prevented from occurring due to the leakage current.

Figure 5A:
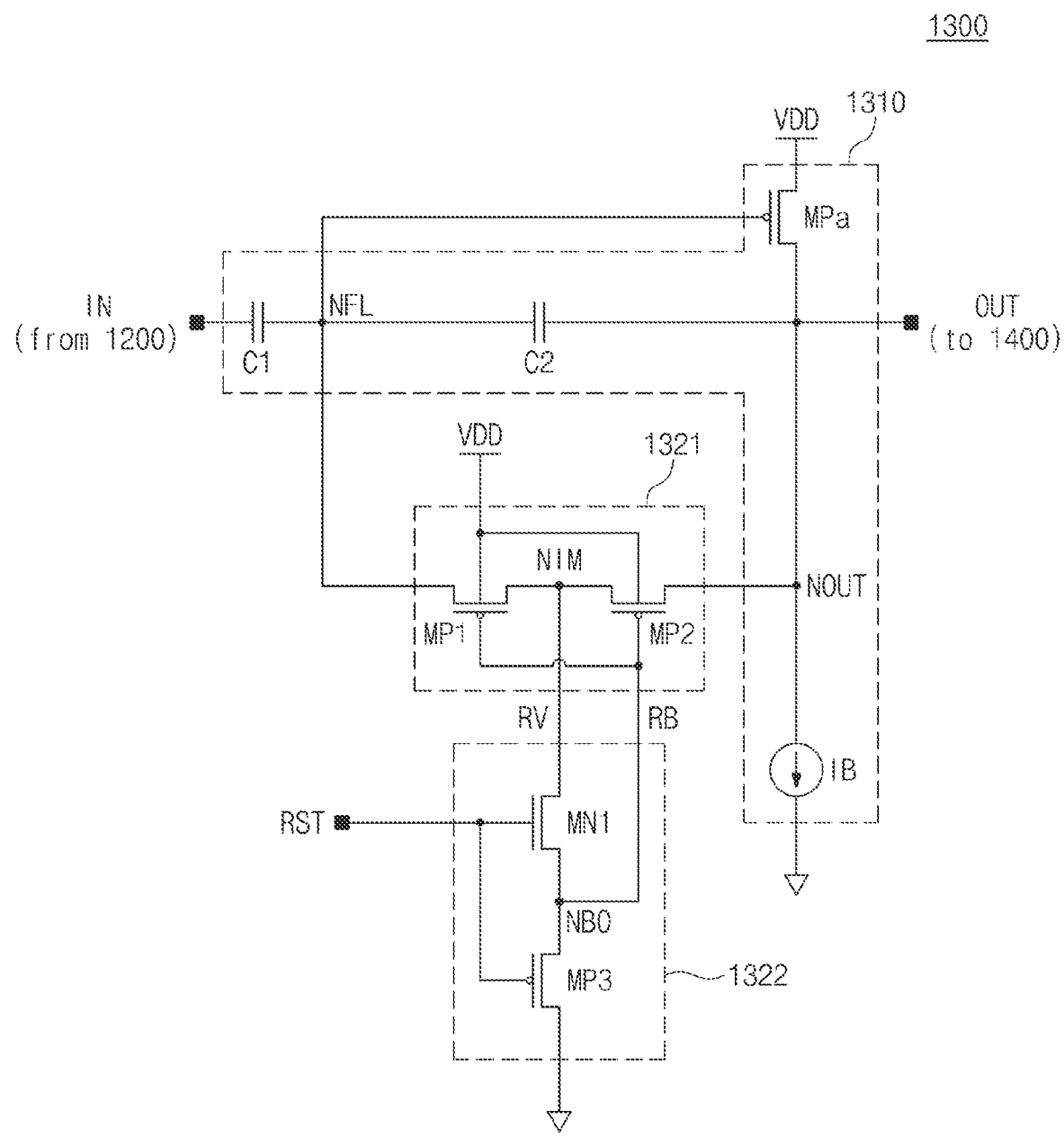
FIG. 5A is a circuit diagram illustrating the amplifier of FIGS. 4A and 4B in detail according to an exemplary embodiment of the inventive concept.
Figure 5B:
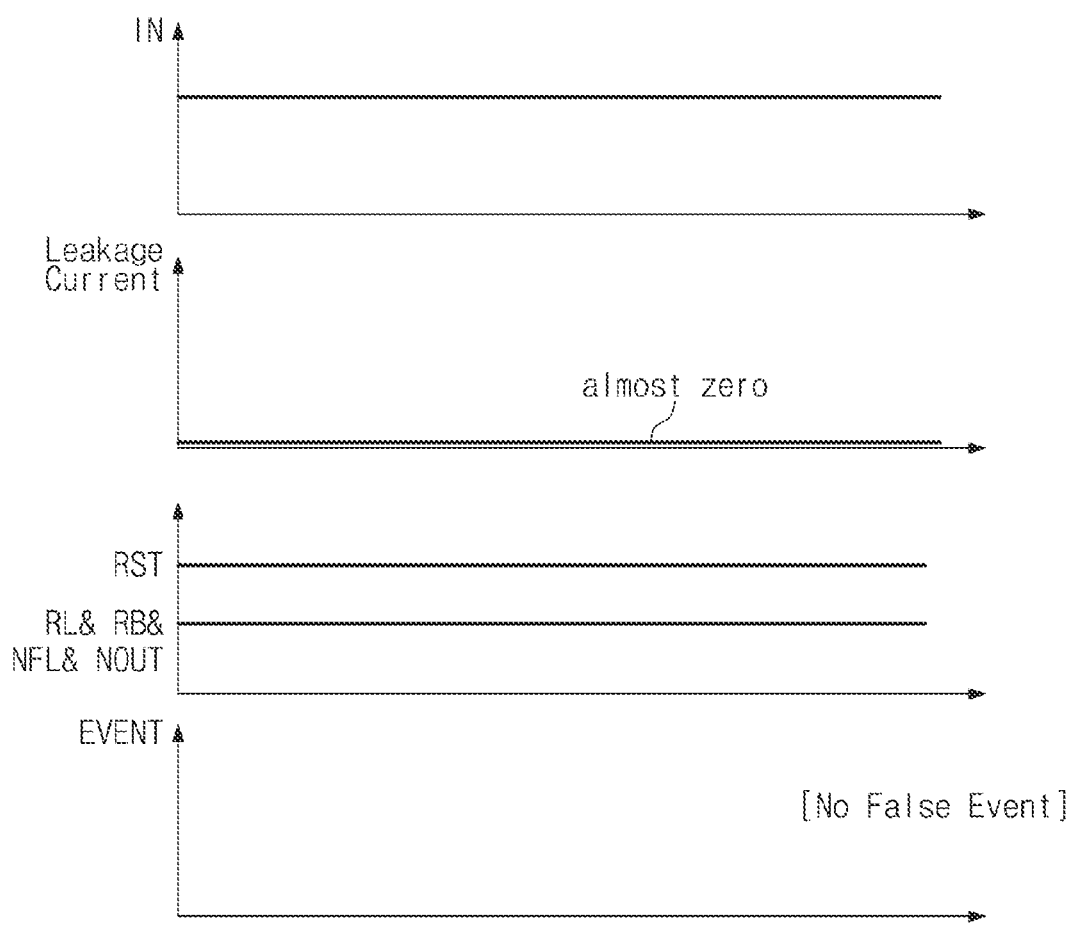
FIGS. 5B and 5C are diagrams for describing an operation of the amplifier of FIG. 5A.
Figure 5C:
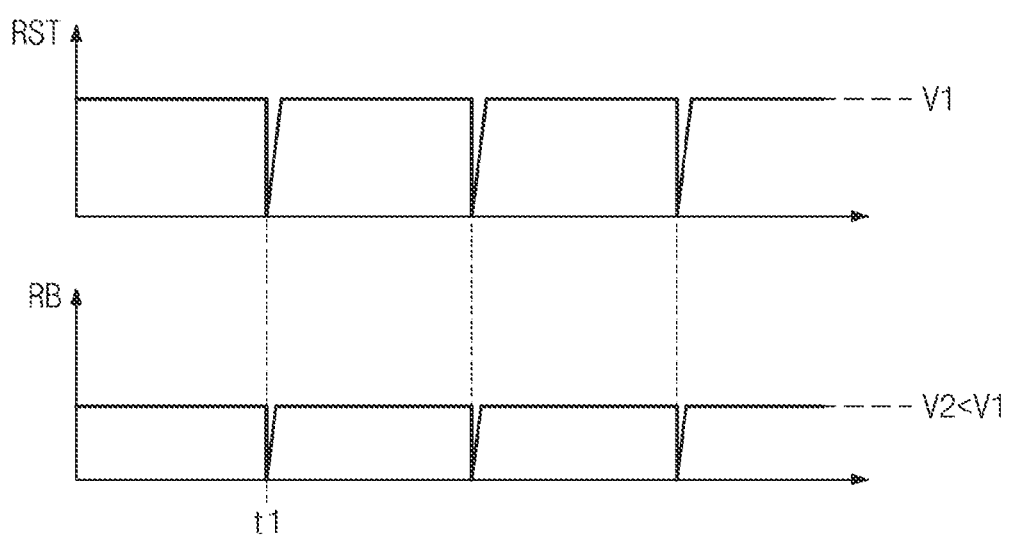

FIG. 5A is a circuit diagram illustrating the amplifier of FIGS. 4A and 4B in detail according to an exemplary embodiment of the inventive concept. FIGS. 5B and 5C are diagrams for describing an operation of the amplifier of FIG. 5A.

Referring to FIGS. 2 and 4A to 5C, the amplifier 1300 may include the amplifying circuit 1310 and the reset circuit 1320. The amplifying circuit 1310 may include the first capacitor C1, the second capacitor C2, the amplifying element MPa, and the current bias IB. A configuration of the amplifying circuit 1310 is described with reference to FIG. 4B. Thus, for convenience of explanation, a further description thereof will be omitted to avoid redundancy.

The reset circuit 1320 may include the reset switch 1321 and the reset bias generator 1322. The reset switch 1321 may include a first PMOS transistor MP1 and a second PMOS transistor MP2. The first PMOS transistor MP1 may be connected between the floating node NFL and an intermediate node NIM and may operate in response to the reset bias RB. For example, the reset bias RB may be applied to the gate of the first PMOS transistor MP1 to control operation of the first PMOS transistor MP1. The second PMOS transistor MP2 may be connected between the intermediate node NIM and the output node NOUT and may operate in response to the reset bias RB. For example, the reset bias RB may be applied to the gate of the second PMOS transistor MP2 to control operation of the second PMOS transistor MP2. The power supply voltage VDD may be provided to a body node of each of the first PMOS transistor MP1 and the second PMOS transistor MP2. The first PMOS transistor MP1 may be referred to as a first reset switch of the reset switch 1321, and the second PMOS transistor MP2 may be referred to as a second reset switch of the reset switch 1321.

The reset bias generator 1322 may generate the reset bias RB based on the reset signal RST and the reset voltage RV. For example, the reset bias generator 1322 may include a first n-type metal oxide semiconductor (NMOS) transistor MN1 and a third PMOS transistor MP3. The first NMOS transistor MN1 may be connected between the intermediate node NIM and a bias output node NBO and may operate in response to the reset signal RST. For example, the reset signal RST may be applied to the gate of the first NMOS transistor MN1 to control operation of the first NMOS transistor MN1. The third PMOS transistor MP3 may be connected between the bias output node NBO and a ground voltage and may operate in response to the reset signal RST. For example, the reset signal RST may be applied to the gate of the third PMOS transistor MP3 to control operation of the third PMOS transistor MP3. The reset bias RB may be output through the bias output node NBO. The reset bias generator 1322 may also be referred to as a reset bias generator circuit. The reset bias RB may be one of the reset voltage RV of the intermediate node NIM, the power supply voltage VDD, and the ground voltage VSS.

An operation of the amplifier 1300 of FIG. 5A and an effect obtained through the operation of the amplifier 1300 will be described with reference to FIGS. 5B and 5C. For convenience of description, it is assumed that a level of the input voltage IN provided from the converter 1200 is uniform.

As illustrated in FIG. 5B, in the case in which the reset signal RST is in an inactive state (e.g., a high state or a state of the power supply voltage VDD), a leakage current (or a GIDL current) that flows through the reset switch 1321 (in particular, the first PMOS transistor MP1) is substantially zero. That is, in the case in which the input voltage IN is uniform, because there is no leakage current introduced into the floating node NFL through the reset switch 1321, a voltage of the floating node NFL may also be uniform. In this case, the output voltage OUT of the output node NOUT does not change, and thus, an unintended false event does not occur.

For example, because the reset bias RB generated by the reset bias generator 1322 is substantially equal to a voltage of the floating node NFL, a leakage current may be prevented from being generated at the reset switch 1321. That is, because a level of the input voltage IN is uniform or because the input voltage IN does not change, in an ideal case, the output voltage OUT does not change, and thus, a false event does not occur.

In an exemplary embodiment, as illustrated in FIG. 5C, at a first time t1, the reset signal RST may be activated (e.g., may have a low level or the ground voltage VSS). This reset signal RST may be based on an actually occurred event, not a false event. In this case, in response to the activated reset signal RST, the first NMOS transistor MN1 of the reset bias generator 1322 may be turned off, and the third PMOS transistor MP3 thereof may be turned on. In this case, a voltage of the bias output node NBO may decrease to the ground voltage VSS, and thus, the reset bias RB may become the ground voltage VSS. That is, the reset bias RB may be activated.

The first PMOS transistor MP1 and the second PMOS transistor MP2 of the reset switch 1321 may be turned on by the activated reset bias RB (e.g., the reset bias RB of the low level or the ground voltage VSS). As such, the floating node NFL, the output voltage node NOUT, and the intermediate node NIM may be reset to the reset voltage RV.

In this case, the reset voltage RV may be determined by a physical characteristic of the current bias IB or a physical characteristic of the amplifying element MPa. A level of the reset voltage RV may be lower than a level of the deactivated reset signal RST (e.g., a level of the power supply voltage VDD). In an exemplary embodiment, a peak level of the reset bias RB may be substantially equal to the level of the reset voltage RV. Accordingly, as illustrated in FIG. 5C, the peak level of the reset signal RST may be a first voltage V1, and the peak level of the reset bias RB may be a second voltage V2 lower than the first voltage V1.

Subsequently, the reset signal RST may be deactivated (e.g., may transition to the high level or may have the power supply voltage VDD). In this case, in response to the deactivated reset signal RST, the first NMOS transistor MN1 of the reset bias generator 1322 may be turned on, and the third PMOS transistor MP3 thereof may be turned off. As such, a voltage (e.g., the reset voltage RV) of the intermediate node NIM may be transferred to the bias output node NBO by the operation of the reset bias generator 1322. Subsequently, while the reset signal RST remains at the inactive state (e.g., is at the high level or has the power supply voltage VDD), the bias output node NBO may maintain the reset voltage RV. For example, subsequently, while the reset signal RST remains at the inactive state (e.g., is at the high level or has the power supply voltage VDD), the reset bias RB may be substantially equal to the reset voltage RV, or a difference between the reset bias RB and the reset voltage RV may be small enough to ignore.

As described above, the floating node NFL, the output node NOUT, and the intermediate node NIM all may be reset to the reset voltage RV by the reset operation of the reset switch 1321. Subsequently, the reset bias RB may maintain the reset voltage RV in a state in which all of the first and second PMOS transistors MP1 and MP2 of the reset switch 1321 are turned off. In this case, because levels of the reset bias RB and the floating node NFL are substantially equal to a level of the reset voltage RV, a leakage current (e.g., the GIDL current) may be prevented from being generated at the first PMOS transistor MP1. Accordingly, because a false event due to a leakage current is prevented, the reliability of the amplifier 1300, and thus, the reliability of the image sensor device 1000 including the amplifier 1300, is improved.

Figure 6A:
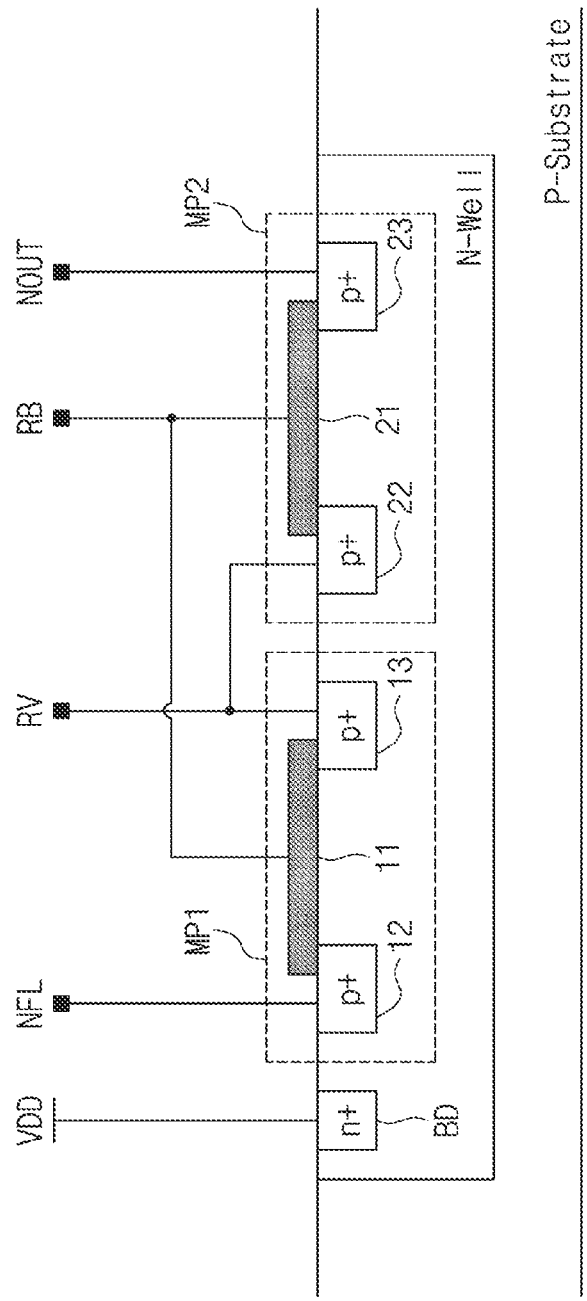
FIGS. 6A and 6B are cross-sectional views illustrating a reset switch of FIG. 5A according to exemplary embodiments of the inventive concept.
Figure 6B:
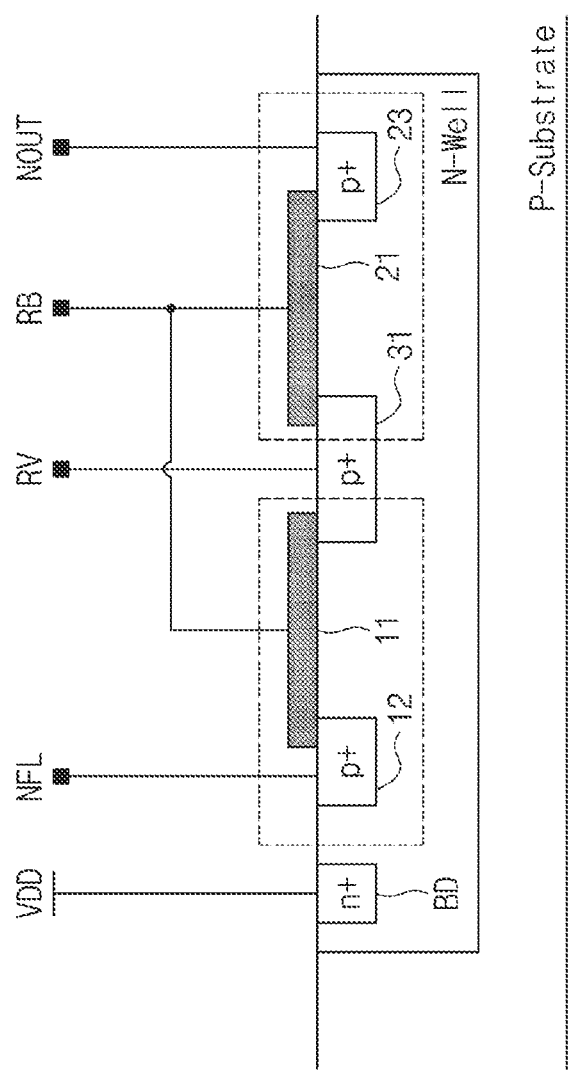

FIGS. 6A and 6B are cross-sectional views illustrating the reset switch of FIG. 5A according to exemplary embodiments of the inventive concept.

Referring to FIGS. 5A and 6A, a reset switch 1321-1 may include the first and second PMOS transistors MP1 and MP2. The first and second PMOS transistors MP1 and MP2 may be formed on a p-type substrate.

For example, as illustrated in FIG. 6A, the first PMOS transistor MP1 may include a gate node 11, a drain node 12, and a source node 13 formed on the p-type substrate. The gate node 11 of the first PMOS transistor MP1 may be a metal oxide placed above an n-well formed in the p-substrate, and each of the drain node 12 and the source node 13 may be a p+ area (or a p-type doping area) formed in the n-well.

As illustrated in FIG. 6A, the second PMOS transistor MP2 may include a gate node 21, a drain node 22, and a source node 23 formed on the p-type substrate. The gate node 21 of the second PMOS transistor MP2 may be a metal oxide placed above the n-well formed in the p-type substrate, and each of the drain node 22 and the source node 23 may be a p+ area (or a p-type doping area) formed in the n-well. In an exemplary embodiment, a body node BD of each of the first and second PMOS transistors MP1 and MP2 may be an n+ well, and the power supply voltage VDD may be provided to the n-well through the body node BD.

As described with reference to FIG. 5A, the drain node of the first PMOS transistor MP1 may be electrically connected to the floating node NFL. The source node 23 of the second PMOS transistor MP2 may be electrically connected to the output node NOUT. The gate nodes 11 and 21 of the first and second PMOS transistors MP1 and MP2 may be electrically connected to the bias output node NBO and may be provided with the reset bias RB from the reset bias generator 1322. The source node 13 of the first PMOS transistor MP1 and the drain node 22 of the second PMOS transistor MP2 may be connected to the intermediate node NIM.

The configuration of the reset switch 1321 is not limited to the exemplary embodiment described with reference to FIG. 6A. For example, as illustrated in FIG. 6B, in an exemplary embodiment, in a reset switch 1321-2, a source node of the first PMOS transistor MP1 and a drain node of the second PMOS transistor MP2 may be formed to share one p+ area 31. The configurations of the reset switches 1321-1 and 1321-2 described with reference to FIGS. 6A and 6B are exemplary, and the inventive concept is not limited thereto.

Figure 7:
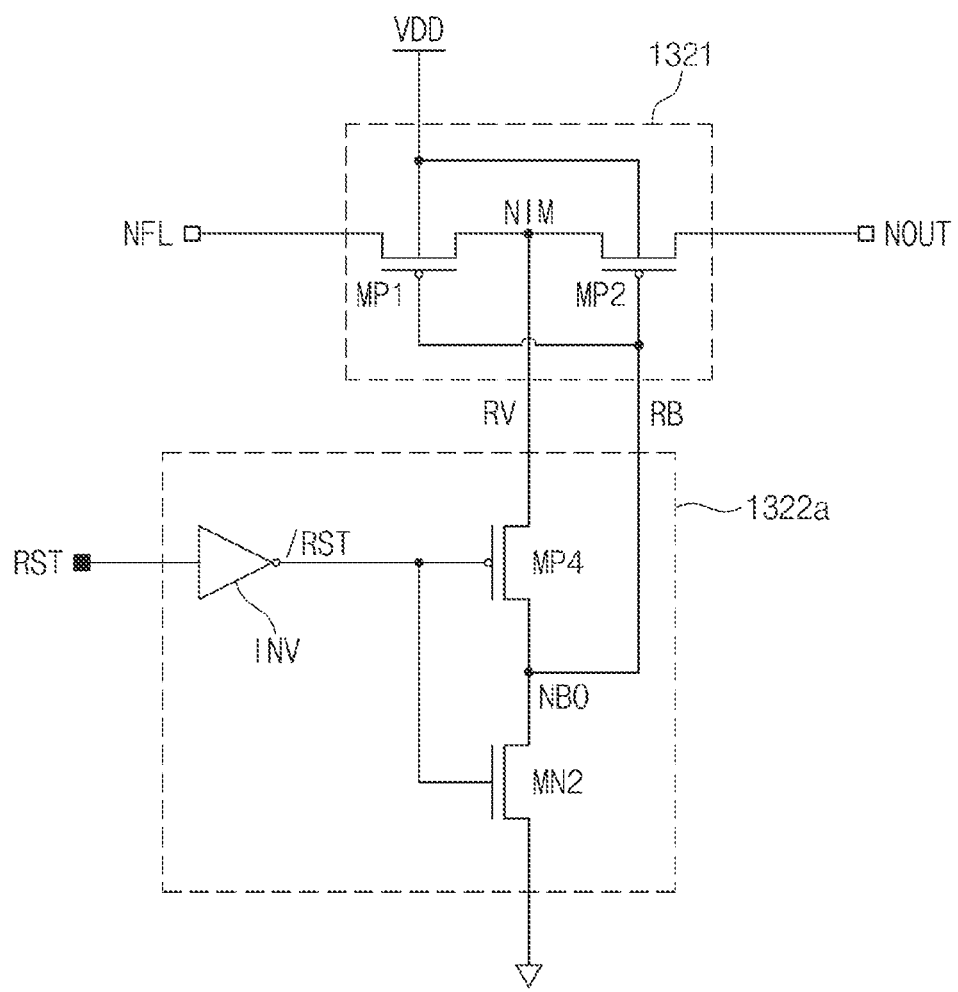
FIG. 7 is a circuit diagram illustrating a reset circuit of FIGS. 4A and 4B according to an exemplary embodiment of the inventive concept.

FIG. 7 is a circuit diagram illustrating the reset circuit of FIGS. 4A and 4B according to an exemplary embodiment of the inventive concept. For convenience of explanation, a further description of elements and aspects previously described may be omitted.

Referring to FIGS. 4A, 4B, and 7, the reset circuit 1320-1 may include the reset switch 1321 and a reset bias generator 1322a. The reset switch 1321 may include the first PMOS transistor MP1 and the second PMOS transistor MP2 connected between the floating node NFL and the output node NOUT. A configuration of the reset switch 1321 is similar to that described with reference to FIG. 5A, and thus, a further description thereof will be omitted to avoid redundancy.

Unlike the reset bias generator 1322 of FIG. 5A, the reset bias generator 1322a of FIG. 7 may include a fourth PMOS transistor MP4, a second NMOS transistor MN2, and an inverter INV. The inverter INV may receive the reset signal RST, may invert the received reset signal RST, and may output an inverted reset signal /RST. In an exemplary embodiment, the inverter INV may be omitted depending on a polarity of the reset signal RST provided from the output logic circuit 1420. For example, the reset signal RST described with reference to FIG. 5C may have a low level in an active state and may have a high level in an inactive state. In the exemplary embodiment of FIG. 7, the inverter INV may be omitted in the case in which a signal (e.g., the inverted reset signal /RST) having an opposite polarity to the reset signal RST is provided from the output logic circuit 1420 described with reference to FIG. 5C.

The fourth PMOS transistor MP4 may be connected between the intermediate node NIM and the bias output node NBO and may operate in response to the inverted reset signal /RST. The second NMOS transistor MN2 may be connected between the bias output node NBO and the ground voltage and may operate in response to the inverted reset signal /RST.

As in the above description, in the case in which the reset signal RST is deactivated, the reset bias generator 1322a may generate the reset bias RB that is substantially equal to the reset voltage RV. For example, as described with reference to FIG. 5C, it is assumed that the reset signal RST remains at the low level (e.g., has the ground voltage VSS) when the reset signal RST is activated, and the reset signal RST remains at the high level (e.g., has the power supply voltage VDD) when the reset signal RST is deactivated.

The inverter INV may receive the reset signal RST of the low level and may output the inverted reset signal /RST of the high level. The fourth PMOS transistor MP4 may be turned off in response to the inverted reset signal /RST of the high level, and the second NMOS transistor MN2 may be turned on in response to the inverted reset signal /RST of the high level. As such, a level of the bias output node NBO may become a level of the ground voltage VSS. That is, when the reset signal RST is activated, the reset bias generator 1322a may output the reset bias RB of the low level (or the ground voltage VSS).

All of the first and second PMOS transistors MP1 and MP2 of the reset switch 1321 may be turned on in response to the reset bias RB of the low level, and thus, the floating node NFL, the output node NOUT, and the intermediate node NIM may be reset to the reset voltage RV.

Subsequently, when the reset signal RST is deactivated, the inverter INV may output the inverted reset signal /RST of the low level. The second NMOS transistor MN2 may be turned off in response to the inverted reset signal /RST of the low level, and the fourth PMOS transistor MP4 may be turned on in response to the inverted reset signal /RST of the low level. As the fourth PMOS transistor MP4 is turned on, the reset voltage RV of the intermediate node NIM may be provided to the bias output node NBO. That is, when the reset signal RST is deactivated, the reset bias generator 1322a may output the reset bias RB that is substantially equal to the reset voltage RV.

In an exemplary embodiment, the fourth PMOS transistor MP4 and the second NMOS transistor MN2 may constitute an inverter that operates based on the reset voltage RV of the intermediate node NIM. The inverter formed by the fourth PMOS transistor MP4 and the second NMOS transistor MN2 may re-invert the inverted reset signal /RST output by the inverter INV based on the reset voltage, and may output the reset bias RB through the bias output node NBO. That is, the reset bias generator 1322a may invert the reset signal RST to generate the inverted reset signal /RST and may then invert the inverted reset signal /RST based on the reset voltage RV to output the reset bias RB.

The effect (e.g., the effect of preventing a leakage current and preventing a false event from occurring due to the leakage current) that are obtained through the reset bias RB is described above, and thus, an additional description thereof will be omitted to avoid redundancy.

Figure 8:
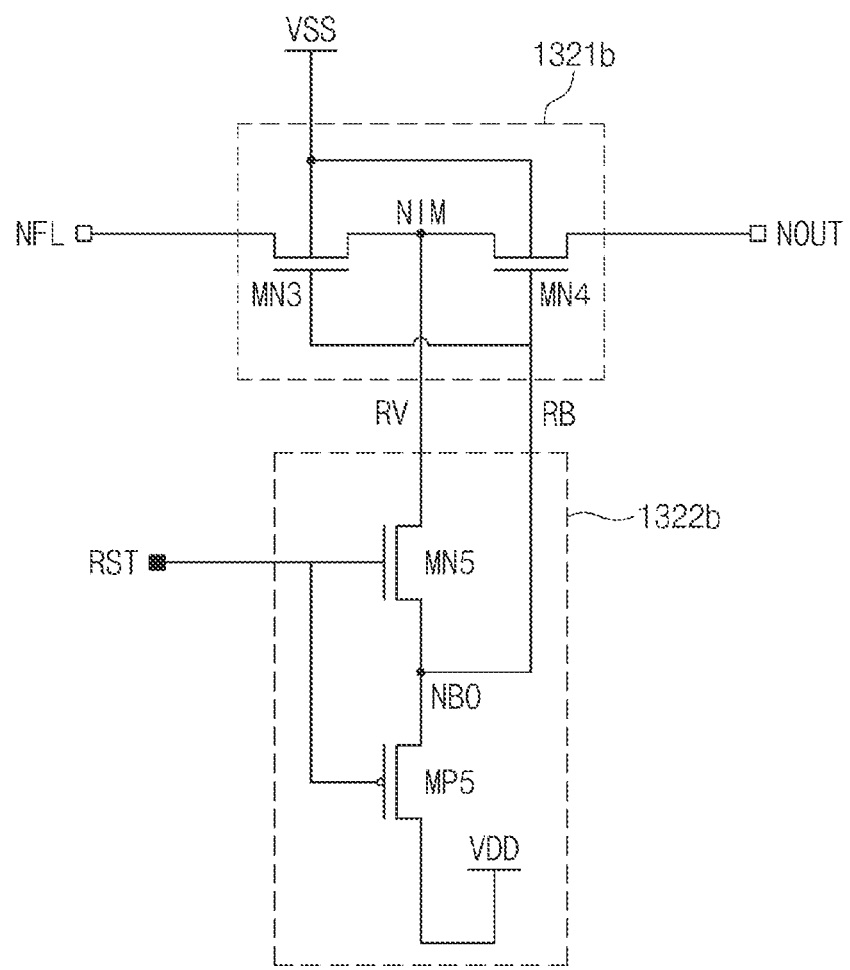
FIG. 8 is a circuit diagram illustrating a reset circuit of FIGS. 4A and 4B according to an exemplary embodiment of the inventive concept.

FIG. 8 is a circuit diagram illustrating the reset circuit of FIGS. 4A and 4B according to an exemplary embodiment of the inventive concept. For convenience of explanation, a further description of elements and aspects previously described will be omitted to avoid redundancy. Referring to FIGS. 4A and 8, a reset circuit 1320-2 may include a reset switch 1321b and a reset bias generator 1322b.

For example, the reset switch 1321b may include third and fourth NMOS transistors MN3 and MN4. The third NMOS transistor MN3 may be connected between the floating node NFL and the intermediate node NIM and may operate in response to the reset bias RB. The fourth NMOS transistor MN4 may be connected between the output node NOUT and the intermediate node NIM and may operate in response to the reset bias RB. In an exemplary embodiment, the ground voltage VSS may be applied to body nodes of the third and fourth NMOS transistors MN3 and MN4. In an exemplary embodiment, the third and fourth NMOS transistors MN3 and MN4 included in the reset switch 1321b may be formed in a pocket p-well in a deep n-well that is formed in the p-type substrate. The third NMOS transistor MN3 may be referred to as a first reset switch of the reset switch 1321b, and the fourth NMOS transistor MN4 may be referred to as a second reset switch of the reset switch 1321b.

The reset bias generator 1322b may include a fifth NMOS transistor MN5 and a fifth PMOS transistor MP5. The fifth NMOS transistor MN5 may be connected between the intermediate node NIM and the bias output node NBO and may operate in response to the reset signal RST. The fifth PMOS transistor MP5 may be connected between the bias output node NBO and the power supply voltage VDD and may operate in response to the reset signal RST.

Unlike the above description, because the reset switch 1321b of the reset circuit 1320-2 includes the third and fourth NMOS transistors MN3 and MN4, the reset switch 1321b may perform a reset operation in response to the reset bias RB of the high level. That is, the reset bias generator 1322b may output the reset bias RB of the high level or the power supply voltage VDD in response to the activated reset signal RST (e.g., having the low level or the ground voltage VSS). Alternatively, the reset bias generator 1322b may output the reset bias RB substantially equal to the reset voltage RV, in response to the deactivated reset signal RST (e.g., having the high level or the power supply voltage VDD). The third and fourth NMOS transistors MN3 and MN4 may be turned on in response to the reset bias RB being the power supply voltage VDD.

The configuration and operation of the reset circuit 1320-2 of FIG. 8 is substantially equal to those of the reset circuits 1320 and 1320-1 described above, except that a type of each transistor is switched from an NMOS transistor to a PMOS transistor, or from a PMOS transistor to an NMOS transistor. Thus, for convenience of explanation, a further description of elements and aspects previously described will be omitted to avoid redundancy.

The configuration of the reset bias generator 1322b illustrated in FIG. 8 is exemplary, and the inventive concept is not limited thereto. For example, depending on a polarity of the reset signal RST output from the output logic circuit 1420, the reset bias generator 1322b may further include an inverter for inverting the reset signal RST, or a type of a transistor may be changed (e.g., from a PMOS transistor to an NMOS transistor, or from an NMOS transistor to a PMOS transistor).

Figure 9:
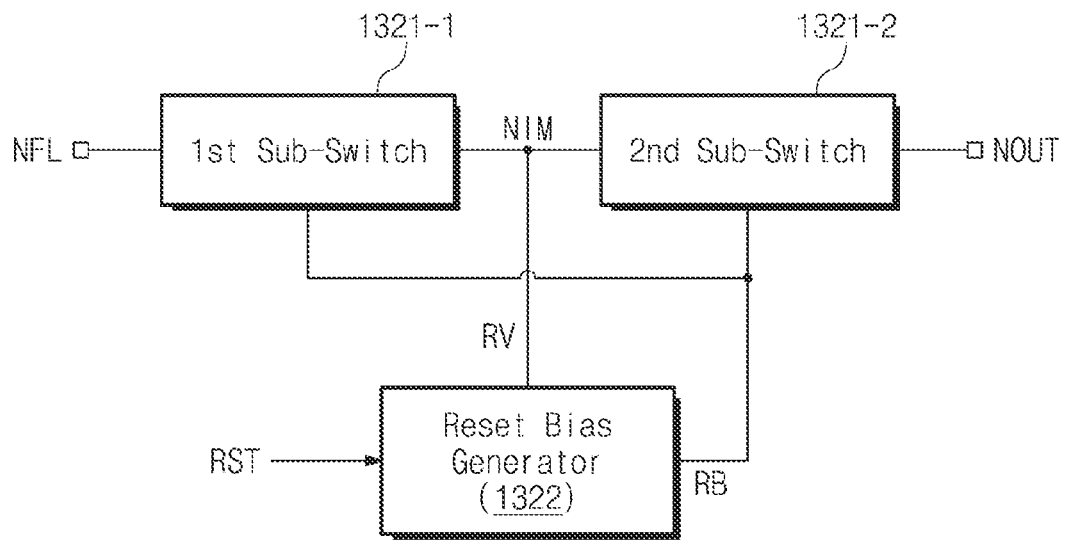
FIG. 9 is a block diagram illustrating a reset circuit of FIG. 4A according to an exemplary embodiment of the inventive concept.

FIG. 9 is a block diagram illustrating a reset circuit of FIG. 4A according to an exemplary embodiment of the inventive concept.

Referring to FIGS. 4A and 9, a reset circuit 1320-3 may include a first sub switch 1321-1, a second sub switch 1321-2, and the reset bias generator 1322.

As in the above description, the reset bias generator 1322 may generate the reset bias RB in response to the reset signal RST. In this case, in the case in which the reset signal RST is in an inactive state, the reset bias RB may be lower in level than the reset signal RST, or the reset bias RB may be substantially equal to the reset voltage RV of the intermediate node NIM.

The first sub switch 1321-1 may be connected between the floating node NFL and the intermediate node NIM and may operate in response to the reset bias RB from the reset bias generator 1322. The second sub switch 1321-2 may be connected between the intermediate node NIM and the output node NOUT and may operate in response to the reset bias RB from the reset bias generator 1322. In an exemplary embodiment, the first and second sub switches 1321-1 and 1321-2 may constitute the reset switch 1321 of FIG. 4A.

In the above-described exemplary embodiments, each of the reset switches 1321 and 1321b may include a first transistor connected between the floating node NFL and the intermediate node NIM and a second transistor connected between the output node NOUT and the intermediate node NIM. However, the inventive concept is not limited thereto. For example, the first sub switch 1321-1 connected between the floating node NFL and the intermediate node NIM of FIG. 9 may include a plurality of transistors that are connected in series, in parallel, or in a combination thereof. Alternatively, the second sub switch 1321-2 connected between the output node NOUT and the intermediate node NIM of FIG. 9 may include a plurality of transistors that are connected in series, in parallel, or in a combination thereof. Each of the plurality of transistors described above may operate in response to the reset bias RB from the reset bias generator 1322. That is, the reset switch 1321 according to an exemplary embodiment of the inventive concept may be implemented by using a plurality of transistors.

Figure 10:
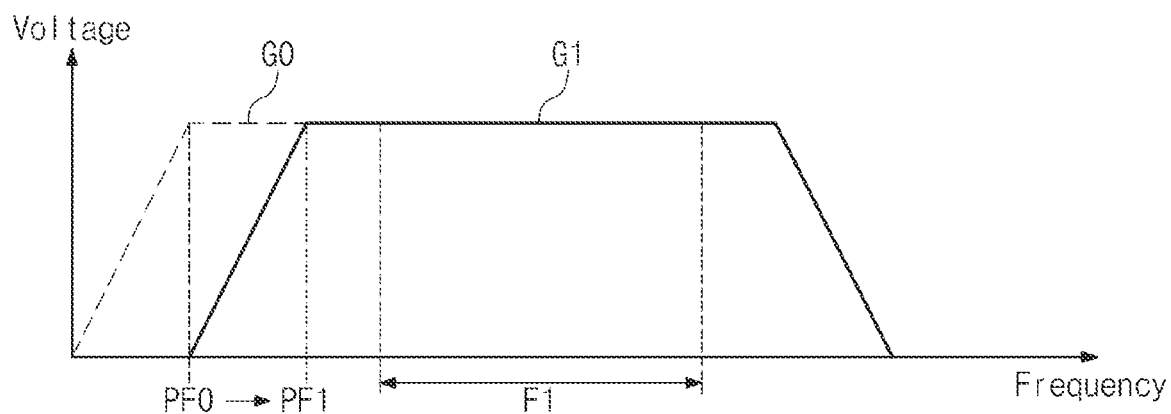
FIG. 10 is a graph for describing a band pass filtering effect according to an operation of a reset circuit of FIG. 4A.

FIG. 10 is a graph for describing a band pass filtering effect according to an operation of the reset circuit 1320 of FIG. 4A.

In an exemplary embodiment, in the graph of FIG. 10, a horizontal axis represents a frequency, and a vertical axis represents a voltage level (or a signal level) passing through the amplifier 1300. Referring to FIGS. 4A and 10, a device noise (or a DC noise) that is introduced into the amplifier 1300 by the reset circuit 1320 may be removed or blocked according to an exemplary embodiment of the inventive concept. For example, a sub-graph G0 of the graph of FIG. 10 illustrates a band pass filtering characteristic in the amplifier (amp) of FIG. 3A, and a sub-graph G1 of the graph of FIG. 10 illustrates a band pass filtering characteristic in the amplifier 1300 of FIG. 4A.

As can be seen from the sub-graphs G0 and G1, the amplifier 1300 according to an exemplary embodiment of the inventive concept may further block a lower band (e.g., a DC noise) compared with the amplifier (amp) of a comparative example. For example, a lower cutoff frequency of the sub-graph G0 may be a frequency PF0, and a lower cutoff frequency of the sub-graph G1 may be a frequency PF1 higher than the frequency PF0. This is because a level of the reset bias RB provided to the reset switch 1321 is lower than a level of the reset signal RST in a state in which the reset switch 1321 is turned off (e.g., the reset signal RST is deactivated). For example, because the reset bias RB lower than the power supply voltage VDD is provided to the first and second PMOS transistors MP1 and MP2 of the reset switch 1321, an equivalent resistance component of the reset switch 1321 may be smaller than an equivalent resistance component of the reset switch (rs) of the amplifier (amp) of FIG. 3A. That is, as the equivalent resistance component of the reset switch 1321 decreases, the lower cutoff frequency of the amplifier 1300 may increase from the frequency PF0 to the frequency PF1.

As the lower cutoff frequency PF1 increases, a signal in a wider lower band may be blocked, and thus, a DC noise introduced into the amplifier 1300 may be effectively blocked. In an exemplary embodiment, an effective signal range of the amplifier 1300 may be a first frequency range F1. That is, even though a lower cutoff frequency of the amplifier 1300 according to an exemplary embodiment of the inventive concept increases to the first cutoff frequency PF1, the amplifier 1300 or the image sensor device 1000 including the amplifier 1300 may operate normally.

Figure 11:
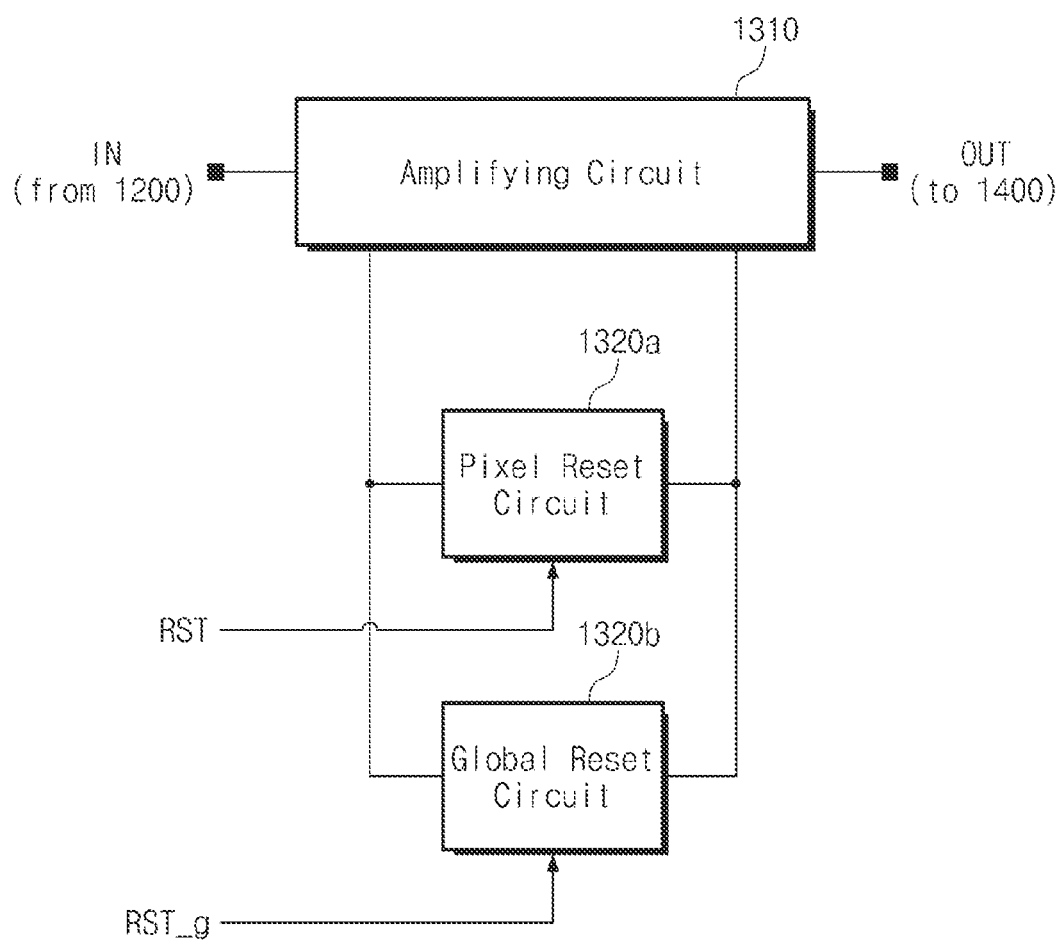
FIG. 11 is a block diagram illustrating an amplifier of FIG. 2 according to an exemplary embodiment of the inventive concept.

FIG. 11 is a block diagram illustrating the amplifier of FIG. 2 according to an exemplary embodiment of the inventive concept.

Referring to FIGS. 2 and 11, an amplifier 1300-1 may include the amplifying circuit 1310, a pixel reset circuit 1320a, and a global reset circuit 1320b. The amplifying circuit 1310 may be connected between the input node receiving the input voltage IN and the output node outputting the output voltage OUT. A structure of the amplifying circuit 1310 may be similar to the structure of the amplifying circuit 1310 described with reference to FIG. 4B or 5B. Thus, for convenience of explanation, a further description thereof will be omitted to avoid redundancy.

The pixel reset circuit 1320a and the global reset circuit 1320b may be connected in parallel between the floating node NFL (refer to FIG. 4B) of the amplifying circuit 1310 and the output node NOUT (refer to FIG. 4B). In an exemplary embodiment, each of the pixel reset circuit 1320a and the global reset circuit 1320b may include one of the reset circuits 1320 1320-1, and 1320-2 described with reference to FIGS. 4A to 10 or a combination thereof, and may operate to be similar to the reset circuits 1320 1320-1, and 1320-2.

The pixel reset circuit 1320a may operate in response to the reset signal RST from the output logic circuit 1420. The global reset circuit 1320b may operate in response to a global reset signal RST_g. In an exemplary embodiment, the global reset signal RST_g may be provided from any other component (e.g., an address encoder, an arbiter, or handshaking logic included in the image sensor device 1000) outside the pixel PIX (refer to FIG. 2) or the controller 1010 (refer to FIG. 1). The global reset signal RST_g may be a signal for resetting all or a part of a plurality of pixels PIX included in the image sensor device 1000 at substantially the same time. That is, an amplifier of each of the plurality of pixels PIX included in the image sensor device 1000 may include the pixel reset circuit 1320a and the global reset circuit 1320b, and may perform a pixel reset operation through the pixel reset circuit 1320a depending on a pixel operation (e.g., as an event occurs or an event signal is generated), or may perform a global reset operation through the global reset circuit 1320b under control of an external component (e.g., in response to the global reset signal RST_g). Configurations and reset operations of the pixel reset circuit 1320a and the global reset circuit 1320b are similar to the configuration and the reset operation of the reset circuit 1320, 1320-1, or 1320-2 described above, except for a unit by which a reset operation is performed. Thus, for convenience of explanation, a further description thereof will be omitted to avoid redundancy.

Figure 12:
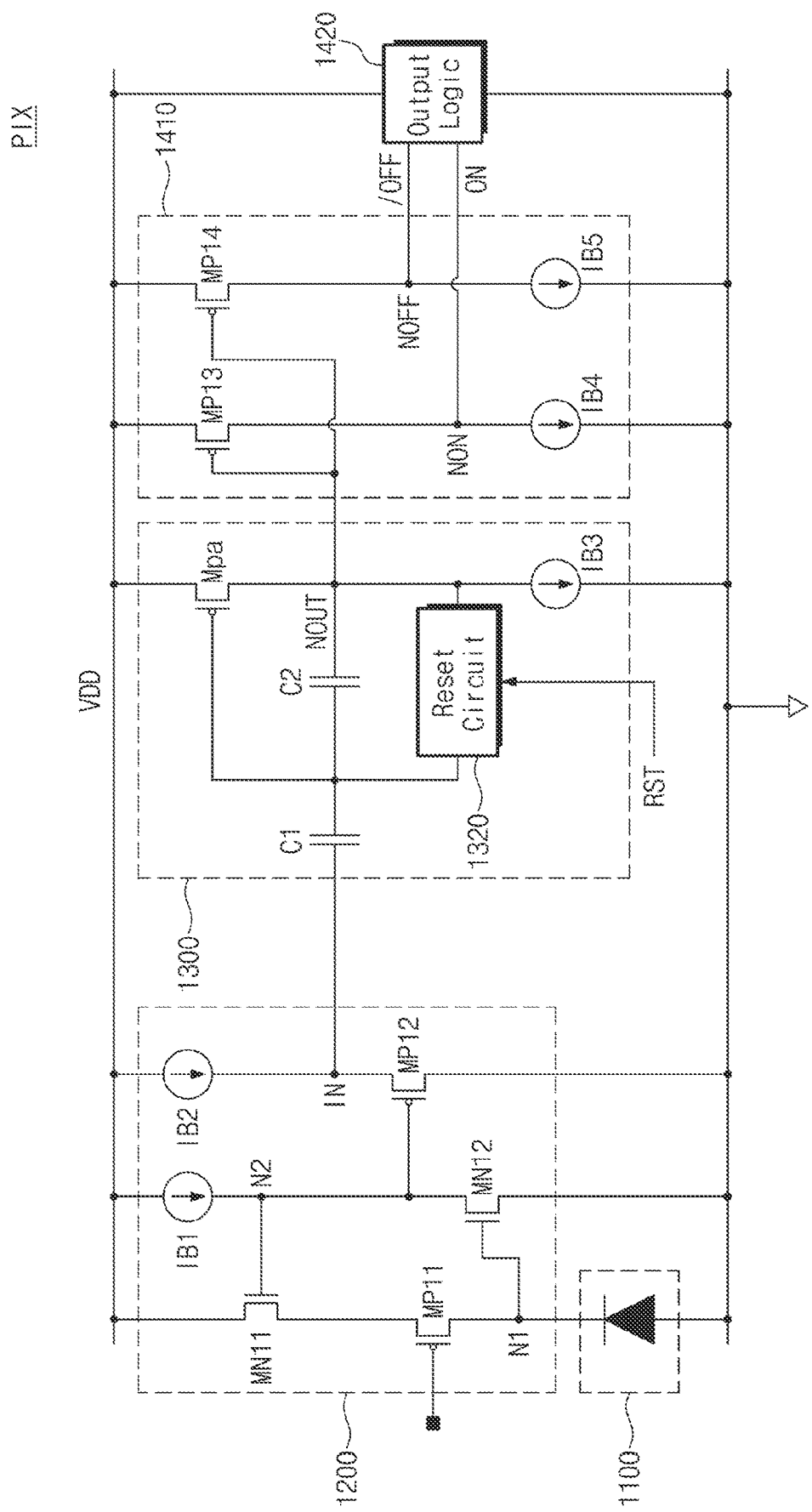
FIG. 12 is a circuit diagram illustrating a pixel of FIG. 2 in detail according to an exemplary embodiment of the inventive concept.

FIG. 12 is a circuit diagram illustrating the pixel of FIG. 2 in detail according to an exemplary embodiment of the inventive concept.

For convenience of description, one pixel PIX will be described. However, the inventive concept is not limited thereto. For example, each of the remaining pixels included in the image sensor device 1000 may have a structure similar to the pixel PIX of FIG. 12. In an exemplary embodiment, the pixel PIX illustrated in FIG. 12 may be a pixel of an event-based sensor or a pixel of a dynamic vision sensor (DVS).

Referring to FIGS. 2 and 12, the pixel PIX may include the photo detector 1100, the converter 1200, the amplifier 1300, the comparator 1410, and the output logic circuit 1420. An operation or a function of each of the photo detector 1100, the converter 1200, the amplifier 1300, the comparator 1410, and the output logic circuit 1420 is described with reference to FIG. 2. Thus, for convenience of explanation, a further description thereof will be omitted to avoid redundancy.

The photo detector 1100 may be a photodiode configured to generate a photo charge corresponding to a light incident from the outside (e.g., from outside of an image sensor device including the photo detector 1100). The photo detector 1100 may be connected between a first node N1 and the ground voltage.

The converter 1200 may include first and second NMOS transistors MN11 and MN12, first and second PMOS transistors MP11 and MP12, and first and second current biases IB1 and IB2. The first NMOS transistor MN11 may be connected between the power supply voltage VDD and the first PMOS transistor MP11 and may operate in response to a voltage of a second node N2. The first PMOS transistor MP11 may be connected between the first NMOS transistor MN11 and the first node N1 and may operate in response to a DC bias from the outside. In an exemplary embodiment, the first PMOS transistor MP11 may operate as a current bias. The second NMOS transistor MN12 may be connected between the second node N2 and the ground voltage and may operate in response to a voltage of the first node N1. The second PMOS transistor MP12 may be connected between the input node providing the input voltage IN to the amplifier 1300 and the ground voltage, and may operate in response to a voltage of the second node N2. The first current bias IB1 may be connected between the power supply voltage VDD and the second node N2. The second current bias IB2 may be connected between the power supply voltage VDD and the input node providing the input voltage IN to the amplifier 1300.

The amplifier 1300 may be connected between the input node receiving the input voltage IN and the output node NOUT outputting an output voltage. The amplifier 1300 may include the first capacitor C1, the second capacitor C2, the amplifying element MPa, a third current bias IB3, and the reset circuit 1320. The components and the connection relationship of the amplifier 1300 are described with reference to FIGS. 1 to 10. Thus, for convenience of explanation, a further description thereof will be omitted to avoid redundancy. In an exemplary embodiment, the reset circuit 1320 may include one of the reset circuits 1320, 1320-1, and 1320-2 described with reference to FIGS. 1 to 11 or a combination thereof, or may include a configuration modified from the reset circuits 1320, 1320-1, and 1320-2 without departing from the scope and spirit of the inventive concept.

The comparator 1410 may include a third PMOS transistor MP13, a fourth PMOS transistor MP14, a fourth current bias IB4, and a fifth current bias IB5. The third PMOS transistor MP13 may be connected between the power supply voltage VDD and an on signal node NON and may operate in response to a voltage of the output node NOUT (e.g., the output voltage OUT from the amplifier 1300). The fourth PMOS transistor MP14 may be connected between the power supply voltage VDD and an off signal node NOFF and may operate in response to a voltage of the output node NOUT (e.g., the output voltage OUT from the amplifier 1300). The fourth current bias IB4 may be connected between the on signal node NON and the ground voltage, and the fifth current bias IB5 may be connected between the off signal node NOFF and the ground voltage.

An on signal ON corresponding to an on-event may be provided to the output logic circuit 1420 through the on signal node NON, and an off signal OFF corresponding to an off-event may be provided to the output logic circuit 1420 through the off signal node NOFF. The output logic circuit 1420 may be connected between the power supply voltage VDD and the ground voltage and may output an event signal based on the on signal ON and the off signal/OFF from the comparator 1410.

Figure 13A:
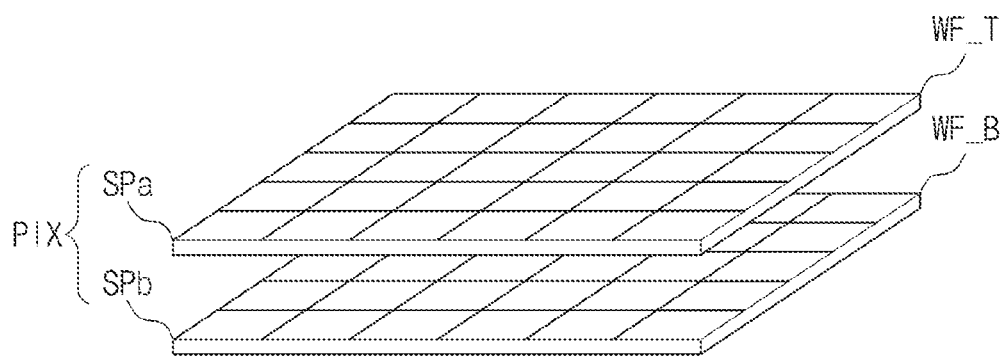
FIGS. 13A and 13B are diagrams illustrating an image sensor device according to an exemplary embodiment of the inventive concept.
Figure 13B:
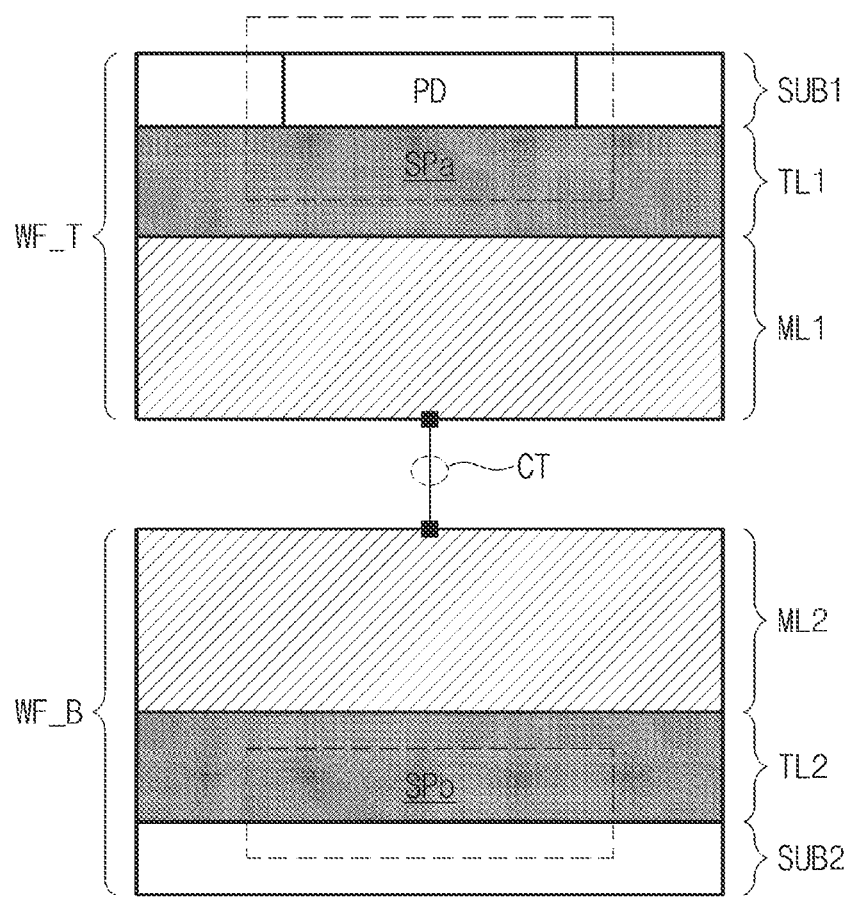

FIGS. 13A and 13B are diagrams illustrating an image sensor device according to an exemplary embodiment of the inventive concept.

Referring to FIGS. 13A and 13B, an image sensor device 2000 may include a plurality of pixels PIX. In an exemplary embodiment, each of the plurality of pixels PIX may be an event-based pixel or a dynamic vision sensor pixel. Each of the plurality of pixels PIX may be, for example, the pixel PIX described with reference to FIGS. 2 and 12.

Each of the plurality of pixels PIX may be divided into first and second sub-pixels SPa and SPb. The first sub-pixel SPa of each of the plurality of pixels PIX may be included in a top wafer WF_T included in the image sensor device 2000, and a second sub-pixel SPb of each of the plurality of pixels PIX may be included in a bottom wafer WF_B included in the image sensor device 2000. For example, the image sensor device 2000 may have a multi-stack structure in which a plurality of semiconductor wafers or a plurality of semiconductor dies are stacked. That is, as illustrated in FIG. 13B, the image sensor device 2000 may include the top wafer WF_T and the bottom wafer WF_B, and the top wafer WF_T and the bottom wafer WF_B may be electrically connected to each other through a connection structure CT. In an exemplary embodiment, the connection structure CT may be a Cu-to-Cu bonding, however, the inventive concept is not limited thereto.

For example, the top wafer WF_T may include a first substrate SUB1, a first transistor layer TL1, and a first metal layer ML1. A photodiode PD may be formed at the first substrate SUB1. The photodiode PD may be the photo detector 1100 described with reference to FIGS. 1 to 12.

The first transistor layer TL1 may be formed on the first substrate SUB1. The first transistor layer TL1 may indicate an area in which a part of various transistors included in the pixel PIX is formed. For example, various components, which are included in the converter 1200 of the pixel PIX of FIG. 12, may be formed at the first transistor layer TL1 on the first substrate SUB1. In an exemplary embodiment, the first transistor layer TL1 may include a plurality of layers for forming various components. The first metal layer ML1 may be formed on the first transistor layer TL1. The first metal layer ML1 may include a plurality of metal lines for electrically connecting the photodiode PD and various components formed at the first transistor layer TL1. In an exemplary embodiment, the first metal layer ML1 may include a plurality of layers for forming the plurality of metal lines. In an exemplary embodiment, components formed at the first substrate SUB1, the first transistor layer TL1, or the first metal layer ML1 included in the top wafer WF_T may constitute the first sub-pixel SPa. As described above, the first sub-pixel SPa may indicate some components of the pixel PIX.

The bottom wafer WF_B may include a second substrate SUB2, a second transistor layer TL2, and a second metal layer ML2. The second transistor layer TL2 may be formed on the second substrate SUB2. The second transistor layer TL2 may include components included in the second sub-pixel SPb. For example, as described above, in the case in which the first sub-pixel SPa includes the photo detector 1100 and the converter 1200 of the components of the pixel PIX, the second sub-pixel SPb may include elements (e.g., transistors, capacitors, and current biases) included in the remaining components (e.g., the amplifier 1300 and the determiner 1400). The elements included in the second sub-pixel SPb may be formed at the second transistor layer TL2. The second metal layer ML2 may be formed on the second transistor layer TL2. The second metal layer ML2 may include a plurality of metal lines for electrically connecting elements included in the second transistor layer TL2. In an exemplary embodiment, the second metal layer ML2 may include a plurality of layers for forming a plurality of metal lines. In an exemplary embodiment, the top wafer WF_T and the bottom wafer WF_B may be electrically connected to each other through the connection structure CT. For example, the first sub-pixel SPa of the top wafer WF_T and the second sub-pixel SPb of the bottom wafer WF_B may be electrically connected to each other through the connection structure CT, and thus, one pixel PIX may be formed.

As described above, the image sensor device 2000 according to an exemplary embodiment of the inventive concept may include the plurality of pixels PIX. Each of the plurality of pixels PIX may be divided into the first and second sub-pixels SPa and SPb. The first sub-pixel SPa of each of the plurality of pixels PIX may be formed at the top wafer WF_T, and the second sub-pixel SPb of each of the plurality of pixels PIX may be formed at the bottom wafer WF_B. The top wafer WF_T and the bottom wafer WF_B may be electrically connected to each other through the connection structure CT, and thus, the plurality of pixels PIX may be respectively formed.

Figure 14A:
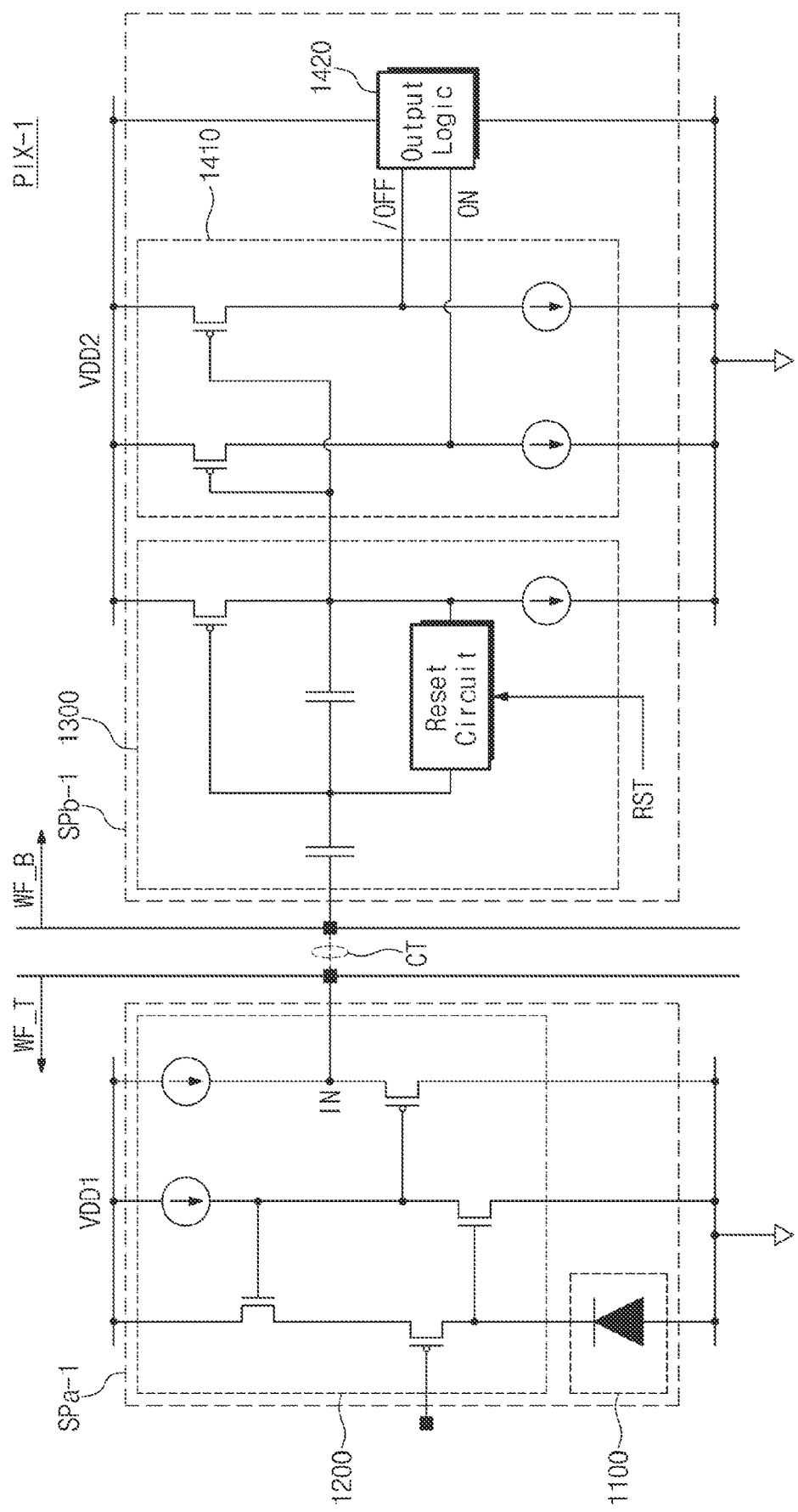
FIGS. 14A to 14C are circuit diagrams illustrating a pixel of FIG. 13A according to exemplary embodiments of the inventive concept.
Figure 14B:
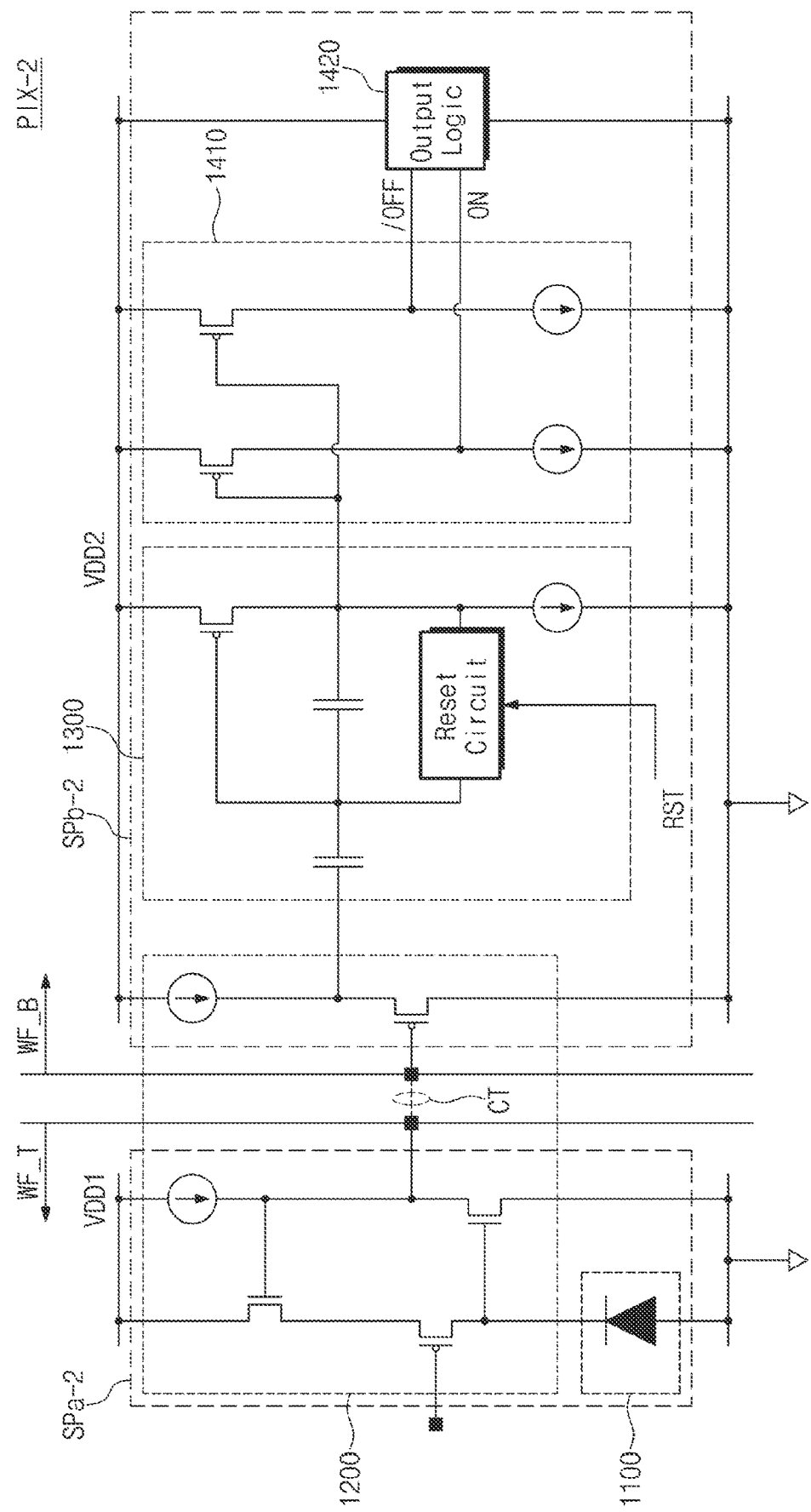
Figure 14C:
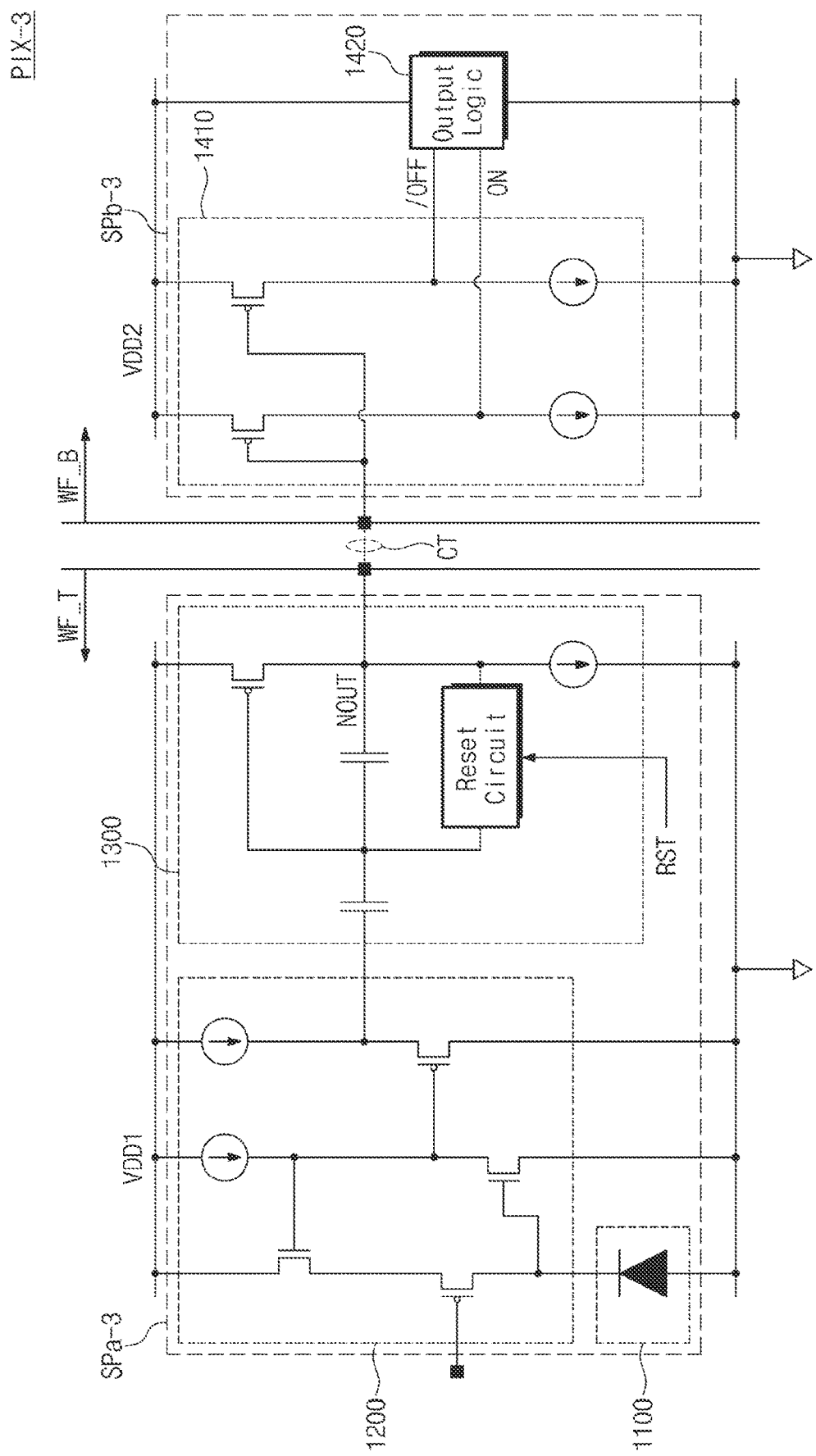

FIGS. 14A to 14C are circuit diagrams illustrating the pixel of FIG. 13A according to exemplary embodiments of the inventive concept. Exemplary embodiments in which the pixel PIX is divided into the first and second sub-pixels SPa and SPb will be described with reference to FIGS. 14A to 14C.

Referring to FIGS. 13A and 14A to 14C, each of pixels PIX-1, PIX-2, and PIX-3 may include the photo detector 1100, the converter 1200, the amplifier 1300, the comparator 1410, and the output logic circuit 1420. In an exemplary embodiment, the amplifier 1300 of each of pixels PIX-1, PIX-2, and PIX-3 may include a reset circuit described with reference to FIGS. 1 to 12 or may operate based on an operating method described with reference to FIGS. 1 to 12. Each of the photo detector 1100, the converter 1200, the amplifier 1300, the comparator 1410, and the output logic circuit 1420 is described above. Thus, for convenience of explanation, a further description thereof will be omitted to avoid redundancy.

As illustrated in FIG. 14A, the first pixel PIX-1 may be divided into a first sub-pixel SPa-1 and a second sub-pixel SPb-1. The first sub-pixel SPa-1 may include the photo detector 1100 and the converter 1200. That is, the photo detector 1100 and the converter 1200 of the first pixel PIX-1 may be formed at the top wafer WF_T. The second sub-pixel SPb-1 may include the amplifier 1300, the comparator 1410, and the output logic circuit 1420. That is, the amplifier 1300, the comparator 1410, and the output logic circuit 1420 of the first pixel PIX-1 may be formed at the bottom wafer WF_B. The first pixel PIX-1 may be implemented by electrically connecting, through the connection structure CT, a terminal outputting the input voltage IN of the converter 1200 in the first sub-pixel SPa-1 and a terminal receiving the input voltage IN of the amplifier 1300 in the second sub-pixel SPb-1, and thus, the first pixel PIX-1 may operate normally.

In an exemplary embodiment, the photo detector 1100 and the converter 1200 of the first sub-pixel SPa-1 formed at the top wafer WF_T may operate based on a first power supply voltage VDD1, and the amplifier 1300, the comparator 1410, and the output logic circuit 1420 of the second sub-pixel SPb-1 formed at the bottom wafer WF_B may operate based on a second power supply voltage VDD2. In an exemplary embodiment, the first power supply voltage VDD1 may be greater than the second power supply voltage VDD2.

Referring to FIG. 14B, the second pixel PIX-2 may be divided into a first sub-pixel SPa-2 and a second sub-pixel SPb-2. The first sub-pixel SPa-2 may include the photo detector 1100 and a portion of the converter 1200. That is, the photo detector 1100 and the portion of the converter 1200 of the second pixel PIX-2 may be formed at the top wafer WF_T. The second sub-pixel SPb-2 may include the remaining portion of the converter 1200, the amplifier 1300, the comparator 1410, and the output logic circuit 1420. That is, the remaining portion of the converter 1200, the amplifier 1300, the comparator 1410, and the output logic circuit 1420 of the second pixel PIX-2 may be formed at the bottom wafer WF_B. The portion of the converter 1200 of the first sub-pixel SPa-2 and the remaining portion of the converter 1200 of the amplifier 1300 of the second sub-pixel SPb-2 may be electrically connected to each other through the connection structure CT. As such, the one second pixel PIX-2 may be implemented, and the second pixel PIX-2 may operate normally.

In an exemplary embodiment, the photo detector 1100 and a portion of the converter 1200 of the first sub-pixel SPa-1 formed at the top wafer WF_T may operate based on the first power supply voltage VDD1, and the remaining portion of the converter 1200, the amplifier 1300, the comparator 1410, and the output logic circuit 1420 of the second sub-pixel SPb-2 formed at the bottom wafer WF_B may operate based on the second power supply voltage VDD2. In an exemplary embodiment, the first power supply voltage VDD1 may be greater than the second power supply voltage VDD2.

Referring to FIG. 14C, the third pixel PIX-3 may be divided into a first sub-pixel SPa-3 and a second sub-pixel SPb-3. The first sub-pixel SPa-3 may include the photo detector 1100, the converter 1200, and the amplifier 1300. That is, the photo detector 1100, the converter 1200, and the amplifier 1300 of the third pixel PIX-3 may be formed at the top wafer WF_T. The second sub-pixel SPb-3 may include the comparator 1410 and the output logic circuit 1420. That is, the comparator 1410 and the output logic circuit 1420 of the third pixel PIX-3 may be formed at the bottom wafer WF_B. The output node NOUT of the amplifier 1300 of the first sub-pixel SPa-3 and the input of the comparator 1410 of the second sub-pixel SPb-3 may be electrically connected to each other through the connection structure CT. As such, the one third pixel PIX-3 may be implemented, and the third pixel PIX-3 may operate normally.

In an exemplary embodiment, the photo detector 1100, the converter 1200, and the amplifier 1300 of the first sub-pixel SPa-3 formed at the top wafer WF_T may operate based on the first power supply voltage VDD1, and the comparator 1410 and the output logic circuit 1420 of the second sub-pixel SPb-3 formed at the bottom wafer WF_B may operate based on the second power supply voltage VDD2. In an exemplary embodiment, the first power supply voltage VDD1 may be greater than the second power supply voltage VDD2.

The configurations of first and second sub-pixels described with reference to FIGS. 14A to 14C are examples for describing an exemplary embodiment of the inventive concept. However, the inventive concept is not limited thereto. For example, the first and second sub-pixels may be divided in various schemes. For example, in an exemplary embodiment, the first sub-pixel SPa may include the photo detector 1100, and the second sub-pixel SPb may include the remaining components (e.g., the converter 1200, the amplifier 1300, the comparator 1410, and the output logic circuit 1420) other than the photo detector 1100. Alternatively, in an exemplary embodiment, the first sub-pixel SPa may include some of various elements of the pixel PIX, and the second sub-pixel SPb may include the remaining elements of the various elements of the pixel PIX.

Figure 15:
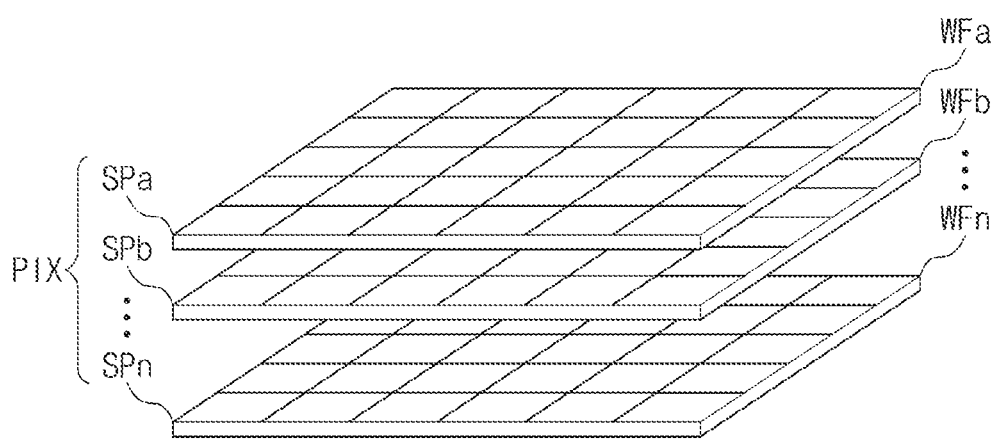
FIG. 15 is a diagram illustrating an image sensor device according to an exemplary embodiment of the inventive concept.

FIG. 15 is a diagram illustrating an image sensor device according to an exemplary embodiment of the inventive concept.

Referring to FIG. 15, an image sensor device 2000-1 may include a plurality of pixels PIX. Each of the plurality of pixels PIX may be divided into a plurality of sub-pixels SPa, SPb . . . SPn (wherein n is a positive integer). The plurality of sub-pixels Spa, SPb . . . SPn may be respectively formed at a plurality of wafers WFa, WFb . . . WFn. The plurality of pixels PIX may be implemented by electrically connecting the plurality of wafers WFa, Wfb . . . WFn. Each of the plurality of pixels PIX may be, for example, the pixel PIX described with reference to FIGS. 2 and 12.

The image sensor device 2000-1 may further include an additional wafer. The additional wafer may include various logic circuits or peripheral circuits (e.g., an address encoder, an arbiter, and handshaking logic) for controlling the plurality of pixels PIX. The additional wafer may be electrically connected to at least one of the plurality of wafers WFa, WFb . . . WFn. The plurality of wafers WFa, WFb . . . WFn and the additional wafer may be electrically connected through a connection structure. The connection structure may be Cu-to-Cu bonding.

Figure 16:
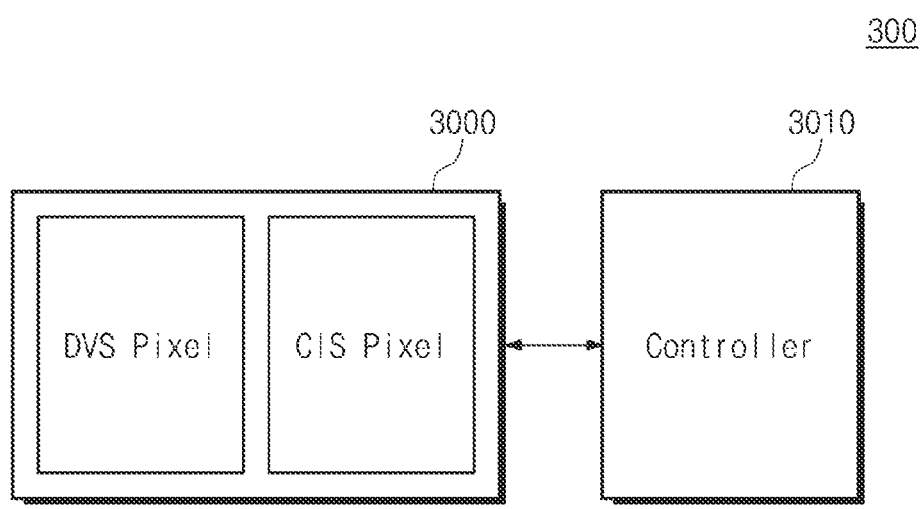
FIG. 16 is a block diagram illustrating an image device according to an exemplary embodiment of the inventive concept.

FIG. 16 is a block diagram illustrating an image device according to an exemplary embodiment of the inventive concept.

Referring to FIG. 16, an image device 300 may include an image sensor device 3000 and a controller 3010. The controller 3010 may be configured to control the image sensor device 3000. The image sensor device 3000 may be configured to generate a signal corresponding to a light incident from the outside.

In an exemplary embodiment, the image sensor device 3000 may include a dynamic vision sensor (DVS) pixel or a CMOS image sensor (CIS) pixel. The DVS pixel may be the pixel PIX described with reference to FIGS. 1 to 15. That is, the DVS pixel may be configured to output an event signal based on the amount of change of a light incident from the outside. The CIS pixel may be configured to output an electrical signal or a digital signal corresponding to a light incident from the outside. That is, the image sensor device 3000 may include both the DVS pixel and the CIS pixel and may perform an operation corresponding to each of the DVS pixel and the CIS pixel.

In an exemplary embodiment, the DVS pixel and the CIS pixel may share some components. For example, the DVS pixel and the CIS pixel may share a photodiode. A photo current generated through the shared photodiode may be provided to the DVS pixel or the CIS pixel.

Figure 17A:
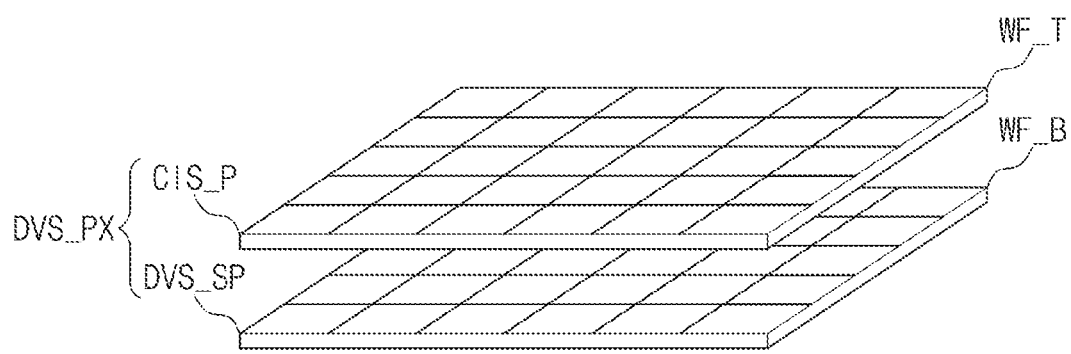
FIGS. 17A and 17B are diagrams illustrating an image sensor device of FIG. 16 according to exemplary embodiments of the inventive concept.
Figure 17B:
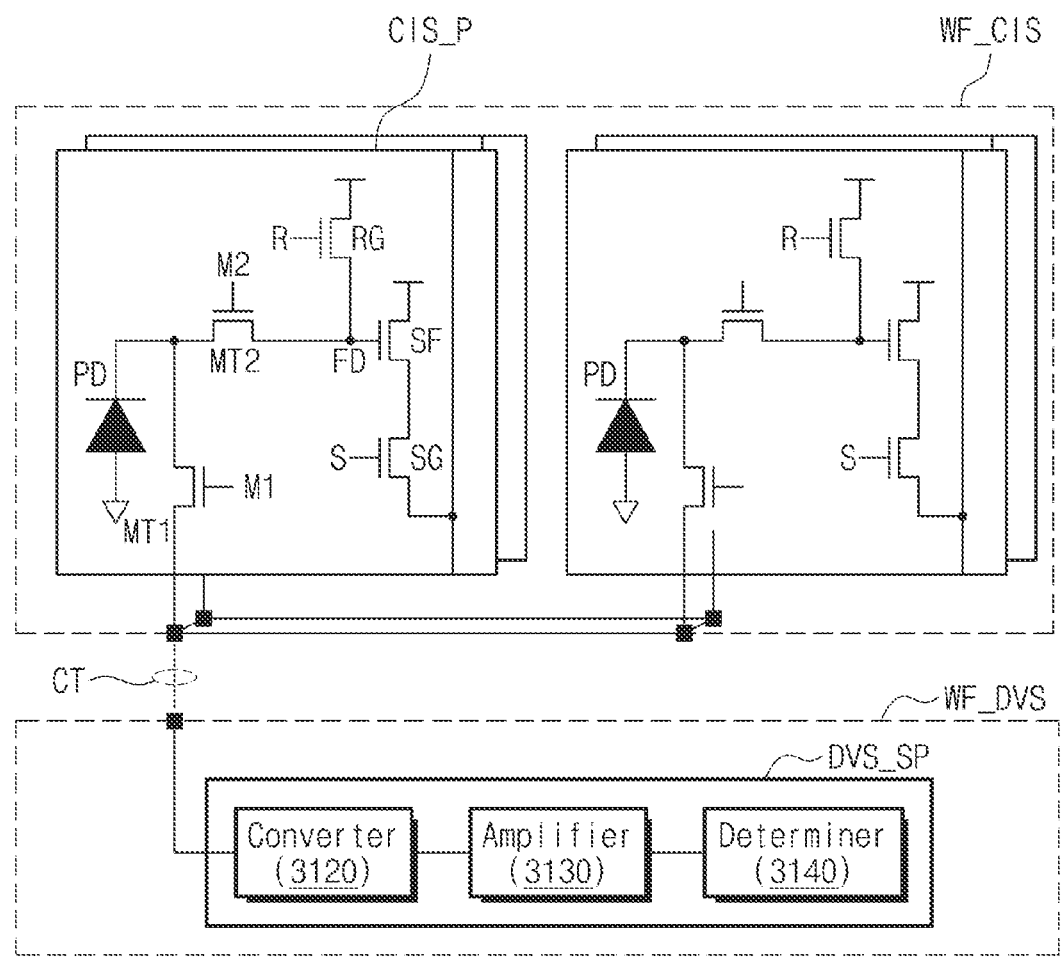

FIGS. 17A and 17B are diagrams illustrating the image sensor device of FIG. 16 according to an exemplary embodiment of the inventive concept.

Referring to FIGS. 16, 17A, and 17B, the image sensor device 3000 may include a CIS wafer WF_CIS and a DVS wafer WF_DVS. The CIS wafer WF_CIS may include a plurality of CIS pixels CIS_P. The DVS wafer WF_DVS may include a plurality of DVS sub-pixels DVS_SP. In an exemplary embodiment, one DVS pixel DVS_PX may be implemented by electrically connecting at least one CIS pixel CIS_P and one DVS sub-pixel DVS_SP to each other.

For example, as illustrated in FIG. 17B, the DVS sub-pixel DVS_SP included in the DVS wafer WF_DVS may include a converter 3120, an amplifier 3130, and a determiner 3140. The converter 3120, the amplifier 3130, and the determiner 3140 are similar to those described with reference to FIGS. 1 to 12. Thus, for convenience of explanation, a further description thereof will be omitted to avoid redundancy. The DVS wafer WF_DVS may be connected to the CIS wafer WF_CIS through the connection structure CT.

The CIS pixel CIS_P included in the CIS wafer WF_CIS may include a photodiode PD, first and second mode switches MT1 and MT2, a reset gate RG, a source follower SF, and a selection gate SG. The photodiode PD may generate a photo current that is proportional to a light incident from the outside. The first mode switch MT1 may be connected between the photodiode PD and the connection structure CT and may operate in response to a first mode signal M1. The second mode switch MT2 may be connected between the photodiode PD and a floating diffusion node FD and may operate in response to a second mode signal M2. The reset gate RG may be connected between a power supply voltage and the floating diffusion node FD and may operate in response to a reset signal R. The source follower SF and the selection gate SG may be connected in series between the power supply voltage and a data line, the source follower SF may operate in response to a voltage of the floating diffusion node FD, and the selection gate SG may operate in response to a selection signal S. The remaining CIS pixels included in the CIS wafer WF_CIS may have a similar structure.

In an exemplary embodiment, the CIS pixel CIS_PX may be used as a CIS pixel for outputting image information depending on an operating mode, or may be used as a portion of the DVS pixel DVS_PX depending on an operating mode. For example, in the case in which the second mode signal M2 is activated and the second mode switch MT2 is turned on, a photo current generated from the photodiode PD may decrease a voltage of the floating diffusion node FD. In this case, in response to the reset signal R and the selection signal S, a signal proportional to the voltage of the floating diffusion node FD may be provided through the data line. That is, in the case in which the second mode signal M2 is activated and the second mode switch MT2 is turned on, the CIS pixel CIS_PX may perform an imaging operation of outputting information proportional to the intensity of the incident light.

In contrast, in the case in which the first mode signal M1 is activated and the first mode switch MT1 is turned on, a signal corresponding to a photo current generated from the photodiode PD may be provided to the DVS sub-pixel DVS_SP of the DVS wafer WF_DVS through the connection structure CT. In this case, the DVS sub-pixel DVS_SP may output an event signal based on the amount of change of a photo current as described with reference to FIGS. 1 to 12. That is, in the case in which the first mode signal M1 is activated and the first mode switch MT1 is turned on, the photodiode PD of the CIS pixel CIS_PX may be used as the photo detector 1100 (refer to FIG. 2) of the DVS pixel DVS_PX. In this case, control signals (e.g., R and S) to be provided the remaining components (e.g., the reset gate RG, the source follower SF, the selection gate SG) of the CIS pixel CIS_PX may not be controlled or may be blocked.

In an exemplary embodiment, the photodiodes PD of the plurality of CIS pixels CIS_PX may be electrically connected with one DVS sub-pixel DVS_SP through the one connection structure CT (or a plurality of connection structures). That is, the photodiodes PD of the plurality of CIS pixels CIS_PX may be used as a photo detector of the one DVS pixel DVS_PX.

In an exemplary embodiment, the CIS pixel CIS_PX illustrated in FIG. 17B may be an image pixel of a 3TR structure except for the first and second mode switches MT1 and MT2. However, the inventive concept is not limited thereto. For example, in exemplary embodiments, the CIS pixel CIS_PX may be implemented with various types of pixel structures such as a 2TR structure and a 4TR structure. In an exemplary embodiment, some of components of the CIS pixel CIS_PX may be used as a mode switch. For example, in a CIS pixel of a 4TR structure, a transmission gate may perform an operation of a transmission gate depending on a control signal, or may make it possible to use the photodiode PD as a photo detector of the DVS pixel DVS_PX by preventing a photo charge of the photodiode PD from being provided to the floating diffusion node FD. Alternatively, a shutter gate of the CIS pixel may perform an operation (e.g., an operation of a mode switch) similar to the transmission gate described above. However, the inventive concept is not limited thereto. Alternatively, the CIS pixels CIS_PX may be arranged in various shapes of patterns such as, for example, a Bayer pattern, a tetra cell pattern, a 2PD pattern, and a 4PD pattern.

Figure 18:
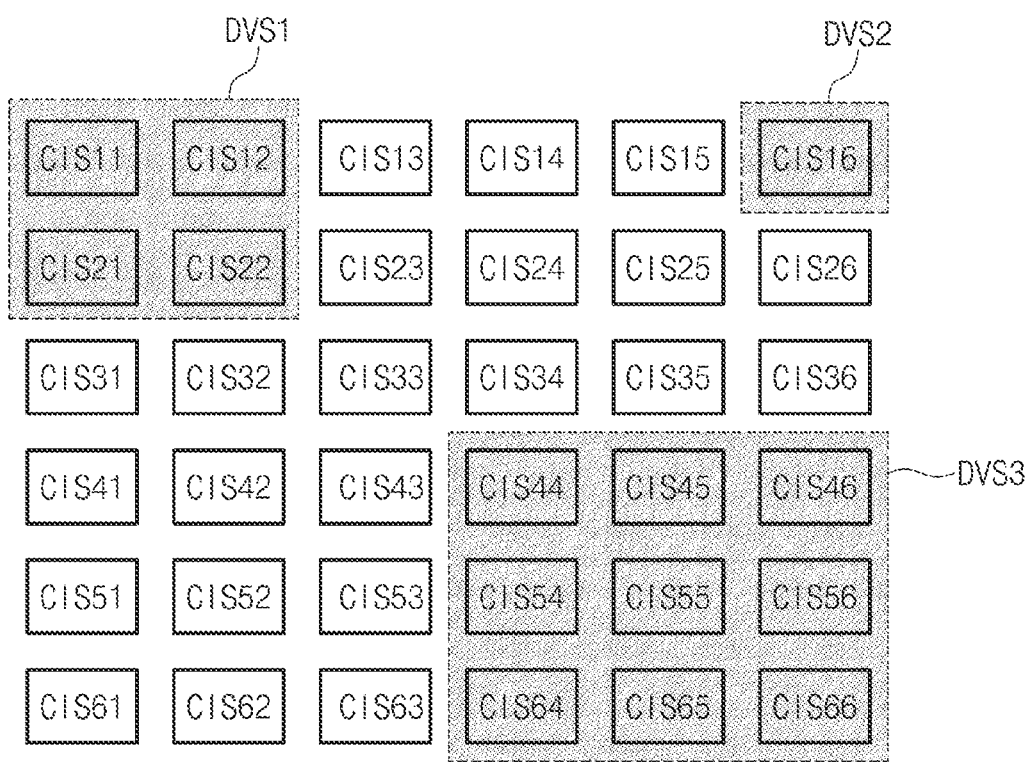
FIG. 18 is a diagram illustrating an image sensor device of FIG. 16 according to an exemplary embodiment of the inventive concept.

FIG. 18 is a diagram illustrating the image sensor device of FIG. 16 according to an exemplary embodiment of the inventive concept.

An arrangement or a pattern of the CIS pixels CIS_PX capable of being used as a portion of the DVS pixel DVS_PX will be described with reference to FIG. 18. FIG. 18 is a plan view illustrating a top surface of the CIS wafer WF_CIS of the image sensor device 3000 according to an exemplary embodiment.

Referring to FIGS. 16 and 18, the image sensor device 3000 may include a plurality of CIS pixels CIS11 to CIS66. Each of the plurality of CIS pixels CIS11 to CIS66 may be configured to output an electrical signal or a digital signal proportional to the intensity of light incident from the outside.

In an exemplary embodiment, some CIS pixels of the plurality of CIS pixels CIS11 to CIS66 may be used to implement a DVS pixel. For example, 2×2 CIS pixels CIS11, CIS12, CIS21, and CIS22 disposed adjacent to each other may be used to implement a first DVS pixel DVS1. That is, photodiodes of the 2×2 CIS pixels CIS11, CIS12, CIS21, and CIS22 disposed adjacent to each other may be used as a photo detector of the first DVS pixel DVS1. Alternatively, one CIS pixel CIS16 may be used to implement a second DVS pixel DVS2. That is, a photodiode of the CIS pixel CIS16 may be used to implement a second DVS pixel DVS2. Alternatively, 3×3 CIS pixels CIS44, CIS45, CIS46, CIS54, CIS55, CIS56, CIS64, CIS65, and CIS66 disposed adjacent to each other may be used to implement a third DVS pixel DVS3. That is, photodiodes of the 3×3 CIS pixels CIS44, CIS45, CIS46, CIS54, CIS55, CIS56, CIS64, CIS65, and CIS66 may be used as a photo detector of the third DVS pixel DVS3.

In the exemplary embodiment of FIG. 18, the image sensor device 3000 is described as including the DVS pixels DVS1, DVS2, and DVS3 formed in various patterns, such as 1×1, 2×2, and 3×3. However, the inventive concept is not limited thereto. For example, in exemplary embodiments, the image sensor device 3000 may dispose DVS pixels depending on a given pattern or may determine CIS pixels to be used as DVS pixels. In an exemplary embodiment, photodiodes of CIS pixels physically spaced apart from each other may be used as a photo detector of one DVS pixel. For example, photodiodes of CIS pixels (e.g., CIS41 and CIS63) physically spaced apart from each other may be connected with one DVS sub-pixel to form one DVS pixel.

Figure 19:
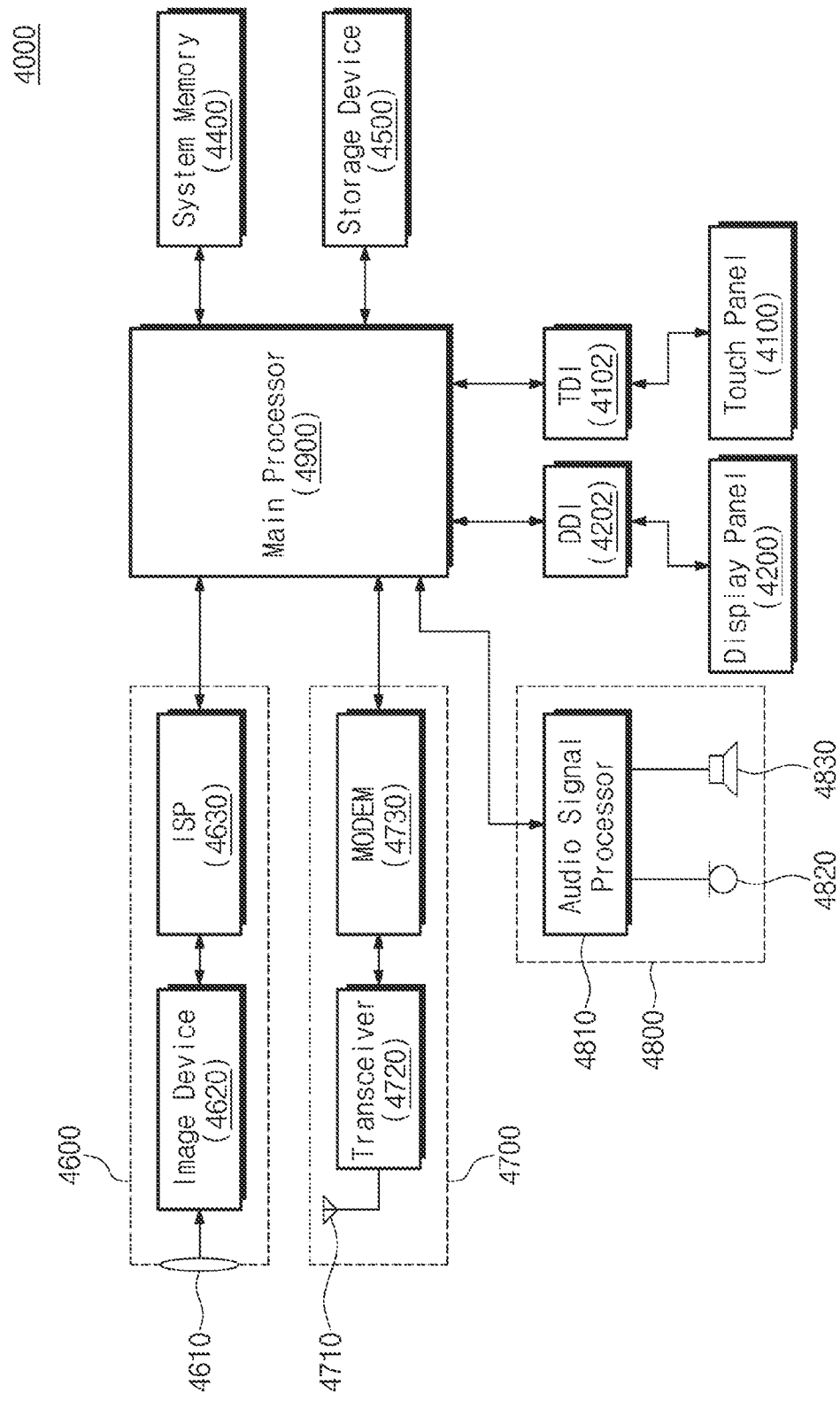
FIG. 19 is a block diagram illustrating an electronic device to which an image signal processor according to an exemplary embodiment of the inventive concept is applied.

FIG. 19 is a block diagram illustrating an electronic device to which an image signal processor according to an exemplary embodiment of the inventive concept is applied.

Referring to FIG. 19, an electronic device 4000 may include a touch panel 4100, a touch driver integrated circuit 4102, a display panel 4200, a display driver integrated circuit 4202, a system memory 4400, a storage device 4500, an image processor 4600, a communication block 4700, an audio processor 4800, and a main processor 4900. In an exemplary embodiment, the electronic device 4000 may be one of various electronic devices such as, for example, a portable communication terminal, a personal digital assistant (PDA), a portable media player (PMP), a digital camera, a smartphone, a tablet computer, a laptop computer, a wearable device, etc.

The touch driver integrated circuit 4102 may be configured to control the touch panel 4100. The touch panel 4100 may be configured to sense a touch input from a user under control of the touch driver integrated circuit 4102. The display driver integrated circuit 4202 may be configured to control the display panel 4200. The display panel 4200 may be configured to display image information under control of the display driver integrated circuit 4202.

The system memory 4400 may store data that are used for an operation of the electronic device 4000. For example, the system memory 4400 may temporarily store data processed or to be processed by the main processor 4900. For example, the system memory 4400 may include a volatile memory such as an SRAM, a DRAM, or an SDRAM, and/or a nonvolatile memory such as a PRAM, an MRAM, a ReRAM, or an FRAM. In an exemplary embodiment, output data output from an image signal processor 4630 may be stored in the system memory 4400.

The storage device 4500 may store data regardless of whether power is supplied. For example, the storage device 4500 may include at least one of various nonvolatile memories such as a flash memory, a PRAM, an MRAM, a ReRAM, and a FRAM. For example, the storage device 4500 may include an embedded memory and/or a removable memory of the electronic device 4000.

The image processor 4600 may receive a light through a lens 4610. An image device 4620 and the image signal processor 4630 included in the image processor 4600 may generate image information about an external object, based on a received light. In an exemplary embodiment, the image device 4620 may be an image sensor device described with reference to FIGS. 1 to 18.

The communication block 4700 may exchange signals with an external device/system through an antenna 4710. A transceiver 4720 and a MODEM (Modulator/Demodulator) 4730 of the communication block 4700 may process signals, which are exchanged with the external device/system, in compliance with one or more of various wireless communication protocols such as, for example, LTE, WiMax, GSM, CDMA, Bluetooth, NFC, Wi-Fi, and RFID.

The audio processor 4800 may process an audio signal by using an audio signal processor 4810. The audio processor 4800 may receive an audio input through a microphone 4820 or may provide an audio output through a speaker 4830.

The main processor 4900 may control overall operations of the electronic device 4000. The main processor 4900 may control/manage operations of the components of the electronic device 4000. The main processor 4900 may process various operations for the purpose of operating the electronic device 4000. In an exemplary embodiment, a part of the components of FIG. 12 may be implemented in the form of a system on chip (SoC) and may be provided as an application processor (AP) of the electronic device 4000.

A reset circuit of an amplifier according to an exemplary embodiment of the inventive concept may remove or prevent a leakage current and a device noise. As such, the reliability of the amplifier may be improved, and the reliability of event-based pixels in which the improved amplifier is included may be improved. Accordingly, an amplifier with improved reliability and an image sensor device including the improved amplifier are provided according to exemplary embodiments of the inventive concept.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

While the inventive concept has been described with reference to the exemplary embodiments thereof, it will be apparent to those of ordinary skill in the art that various changes and modifications may be made thereto without departing from the spirit and scope of the inventive concept as set forth in the following claims.

What is claimed is:

1. An image sensor pixel comprising:
   a photodetector configured to generate a photo current in response to a light incident from an outside of the image sensor pixel;
   a converter configured to convert the photo current into an input voltage;
   an amplifier configured to receive the input voltage through an input node, amplify an amount of change of the input voltage, and output the amplified amount as an output voltage through an output node;
   a comparator circuit configured to compare the output voltage with at least two predetermined threshold values to output a comparison result;
   a reset bias generator configured to output a reset bias based on a reset voltage and a first voltage in response to a reset signal; and
   a reset switch configured to reset the output node of the amplifier to the reset voltage in response to the reset bias.

2. The image sensor pixel of claim 1, wherein the comparator comprises:
a first capacitor connected between the input node and a floating node;
a second capacitor connected between the intermediate node and the output node;
an amplifying p-type metal oxide semiconductor (PMOS) transistor connected between a power supply voltage node and the output node, the amplifying PMOS transistor configured to operate in response a voltage of the floating node; and
a first current bias connected between the output node and a ground node.

3. The image sensor pixel of claim 2, wherein the reset switch comprises:
a first PMOS transistor connected between the floating node and an intermediate node,
the first PMOS transistor configured to operate in response to the reset bias; and
a second PMOS transistor connected between the intermediate node and the output node,
the second PMOS transistor configured to operate in response to the reset bias.

4. The image sensor pixel of claim 3, wherein a power supply voltage is provided into body nodes of the first and second PMOS transistors.

5. The image sensor pixel of claim 3, wherein the reset bias generator comprises:
a first n-type metal oxide semiconductor (NMOS) transistor connected between the intermediate node and a bias output node, the first NMOS transistor configured to operate in response to the reset signal; and
a third PMOS transistor connected between the bias output node and the ground node, the third PMOS transistor configured to operate in response to the reset signal.

6. The image sensor pixel of claim 3, wherein the reset bias generator comprises:
an inverter configured to invert the reset signal;
a third PMOS transistor connected between the intermediate node and a bias output node, the third PMOS transistor configured to operate in response to the inverted reset signal; and
a first n-type metal oxide semiconductor (NMOS) transistor connected between the bias output node and the ground node, the first NMOS transistor configured to operate in response to the inverted reset signal.

7. The image sensor pixel of claim 2, wherein the reset switch comprises:
a first n-type metal oxide semiconductor (NMOS) connected between the floating node and an intermediate node, the first NMOS transistor are configured to operate in response to the reset bias; and
a second NMOS transistor connected between the intermediate node and the output node, the second NMOS transistor configured to operate in response to the reset bias,
wherein the reset switch comprises:
a third NMOS transistor connected between the intermediate node and a bias output node, the third NMOS transistor configured to operate in response to the reset signal; and
a first PMOS transistor connected between the bias output node and the power supply voltage node, the first PMOS transistor configured to operate in response to the reset signal.

8. The image sensor pixel of claim 7, wherein a ground voltage is provided into body nodes of the first and second NMOS transistors.

9. The image sensor pixel of claim 1 further comprises:
an output logic circuit configured to generate the reset signal in response to the comparison result.

10. An image sensor device comprising:
a first semiconductor wafer including a first pixel circuit; and
a second semiconductor wafer stacked on the first semiconductor wafer, the second semiconductor wafer including a first image pixel connected to the first pixel circuit through a connection structure,
wherein the first image pixel comprises:
a first photodiode configured to generate a first photo current in response to a first light incident from an outside of the image sensor device; and
a first mode switch connected between the first photodiode and the connection structure, the first mode switch configured to operate in response to a mode signal,
wherein the first pixel circuit comprises:
a converter configured to receive the first photo current through the connection structure and convert the first photo current into an input voltage;
an amplifier configured to receive the input voltage through an input node, amplify an amount of change of the input voltage, and output the amplified amount as an output voltage through an output node;
a comparator circuit configured to compare the output voltage with at least two predetermined threshold values to output a comparison result;
a reset bias generator configured to output a reset bias based on a reset voltage and a first voltage in response a reset signal; and
a reset switch configured to reset the output node of the amplifier to the reset voltage in response to the reset bias.

11. The image sensor device of claim 10, wherein the first image pixel in the second semiconductor wafer further comprises:
a first transmission gate connected between the first photodiode and a first floating diffusion node, the first transmission gate configured to operate in response to a transmission signal;
a first reset gate connected between the first floating diffusion node and the power supply voltage node, the first reset gate configured to operate in response a reset signal;
a first source follower connected between the power supply voltage node and a first node, the first source follower configured to operate in response to a level of the first floating diffusion node; and
a first selection gate connected between the first node and a first data line, the first selection gate configured to operate in response to a selection signal.

12. The image sensor device of claim 11, wherein the second semiconductor wafer further comprises a second image pixel, the second image pixel including:
a second photodiode configured to generate a second photo current in response to a second light incident from the outside of the image sensor device;
a second mode switch connected between the second photodiode and the connection structure, the second mode switch configured to operate in response to the mode signal.

13. The image sensor device of claim 12, wherein the converter is further configured to receive a sum of the first and second photo currents through the connection structure and convert the sum of the first and second photo currents into the input voltage.

14. The image sensor device of claim 12, wherein the second image pixel further comprises:
   a second transmission gate connected between the second photodiode and a second floating diffusion node, the second transmission gate configured to operate in response to the transmission signal;
   a second reset gate connected between the second floating diffusion node and the power supply voltage node, the second reset gate configured to operate in response the reset signal;
   a second source follower connected between the power supply voltage node and a second node, the second source follower configured to operate in response to a level of the second floating diffusion node; and
   a second selection gate connected between the first node and a second data line, the selection gate configured to operate in response to the selection signal.

15. The image sensor device of claim 14, wherein the connection structure is a Cu-to-Cu bonding structure.

16. The images sensor device of claim 10, wherein when the mode signal is activated, the image sensor device operates as a dynamic vision sensor (DVS), and when the mode signal is deactivated, the image sensor device operates as a CMOS image sensor (CIS).

17. A semiconductor circuit comprising:
   a first switch connected between a first node and a second node, the first switch configured to operate in response to a reset bias;
   a second switch connected between the second node and a third node, the second switch configured to operate in response to the reset bias; and
   a reset bias generator configured to output one of a voltage of the second node and a first voltage as the reset bias in response to a reset signal.

18. The semiconductor circuit of claim 17, wherein the first switch comprises a first p-type metal oxide semiconductor (PMOS) transistor connected between the first and second nodes, the first PMOS transistor configured to operate in response to the reset bias,
   the second switch comprises a second PMOS transistor connected between the second and third nodes, the second PMOS transistor configured to operate in response to the reset bias, and
   a power supply voltage is provided into body nodes of the first and second PMOS transistors.

19. The semiconductor circuit of claim 18, wherein when the reset bias has the voltage of the second node, the first and second switches are turned-off, and when the reset bias has the first voltage, the first and second switches are turned-on.

20. The semiconductor circuit of claim 17, wherein the first node is an input node of an external amplifier, and the third node is an output node of the external amplifier.

* * * * *